United States Patent
Chibvongodze et al.

(10) Patent No.: US 11,024,385 B2
(45) Date of Patent: Jun. 1, 2021

(54) PARALLEL MEMORY OPERATIONS IN MULTI-BONDED MEMORY DEVICE

(71) Applicant: SanDisk Technologies LLC, Addision, TX (US)

(72) Inventors: Hardwell Chibvongodze, Hiratsuka (JP); Masatoshi Nishikawa, Nagoya (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/415,377

(22) Filed: May 17, 2019

(65) Prior Publication Data

US 2020/0365210 A1   Nov. 19, 2020

(51) Int. Cl.

| | |
|---|---|
| *G11C 11/34* | (2006.01) |
| *G11C 16/10* | (2006.01) |
| *G11C 7/06* | (2006.01) |
| *G11C 16/08* | (2006.01) |
| *G11C 16/24* | (2006.01) |
| *G11C 16/26* | (2006.01) |
| *H01L 27/11524* | (2017.01) |
| *H01L 27/11582* | (2017.01) |
| *H01L 27/11556* | (2017.01) |
| *H01L 27/1157* | (2017.01) |
| *H01L 27/11519* | (2017.01) |
| *H01L 27/11565* | (2017.01) |
| *G11C 16/34* | (2006.01) |

(52) U.S. Cl.
CPC ................ *G11C 16/10* (2013.01); *G11C 7/06* (2013.01); *G11C 16/08* (2013.01); *G11C 16/24* (2013.01); *G11C 16/26* (2013.01); *G11C 16/3459* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ........... G11C 7/06; G11C 16/08; G11C 16/24; G11C 16/26; G11C 16/3459; H01L 27/11519; H01L 27/11524; H01L 27/11556; H01L 27/11565; H01L 27/1157; H01L 27/11582
See application file for complete search history.

(56) References Cited

U.S. PATENT DOCUMENTS

| | | |
|---|---|---|
| 6,871,257 B2 | 3/2005 | Conley et al. |
| 7,494,846 B2 | 2/2009 | Hsu et al. |

(Continued)

OTHER PUBLICATIONS

Korean Office Action dated Feb. 22, 2021, Korean Patent Application No. KR-10-2020-0035484.

*Primary Examiner* — Uyen Smet
(74) *Attorney, Agent, or Firm* — Vierra Magen Marcus LLP

(57) ABSTRACT

A semiconductor device is disclosed including an integrated memory module. The integrated memory module includes a first semiconductor die comprising first non-volatile memory cells, a second semiconductor die comprising second non-volatile memory cells, and a third semiconductor die comprising control circuitry. The first, the second and the third semiconductor die are bonded together. The control circuitry is configured to control memory operations in the first memory cells in parallel with the second memory cells.

19 Claims, 13 Drawing Sheets

(56) References Cited

U.S. PATENT DOCUMENTS

| | | |
|---|---|---|
| 10,026,492 B2 | 7/2018 | Dutta et al. |
| 2010/0271856 A1* | 10/2010 | Yamazaki ............ G11C 7/1012 |
| | | 365/51 |
| 2012/0051152 A1* | 3/2012 | Hollis ...................... G11C 7/10 |
| | | 365/189.05 |
| 2014/0027771 A1* | 1/2014 | Satoh ..................... G11C 5/025 |
| | | 257/48 |
| 2014/0050021 A1* | 2/2014 | Kim ........................ G11C 7/00 |
| | | 365/163 |
| 2016/0266821 A1* | 9/2016 | Sathyanarayan ...... G11C 29/74 |
| 2016/0351547 A1 | 12/2016 | Koyanagi |
| 2017/0309340 A1 | 10/2017 | Shah et al. |
| 2018/0158809 A1* | 6/2018 | Kim ................... H01L 25/0655 |
| 2019/0206845 A1* | 7/2019 | Ito .......................... G11C 16/08 |

* cited by examiner

1100

Provide a set of memory operation voltages from a control semiconductor die through first pairs of bond pads to a first selected block in a first memory semiconductor die, 1102

Provide the set of memory operation voltages from the control die semiconductor die through second pairs of bond pads to a second selected block in a second memory semiconductor die comprising a second array of non-volatile memory cells, 1104

Receive unit of data at control die, 1202

Transfer a first portion of the unit of data to sense amplifiers associated with the first memory die, 1204

Transfer a second portion of the unit of data to sense amplifiers associated with the second memory die, 1206

Apply program voltage(s) to selected word lines in first and second memory dies using WL driver on control die, 1208

FIG. 12

PARALLEL MEMORY OPERATIONS IN MULTI-BONDED MEMORY DEVICE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Recently, ultra high density memory devices have been proposed using a three-dimensional (3D) structure. One example of a 3D structure is a stacked memory structure having strings of memory cells formed into layers. One such storage device is sometimes referred to as a Bit Cost Scalable (BiCS) architecture. 3D memory structures allow for a high areal density, which as the term is used herein refers to the number of bits that can be stored per surface area. In addition to the memory cells, 3D memory devices include a logic circuit for controlling read/write to the memory cells.

Regardless of the 3D architecture, increased density (e.g., areal density) is desirable. One technique to increase the areal density is to increase the number of memory cell layers in a 3D structure. However, present semiconductor fabrication techniques limit the number of layers of memory cells that can be reliably formed. Also, forming a structure with a greater number of layers of memory cells can dramatically increase fabrication cost.

Having high program and read throughput is also desirable. One technique for increasing high program and read throughput is to increase the number of planes of memory cells per die. However, this increases die size, which is important specification. For semiconductor fabrication techniques, cost typically does not scale linearly with die size. For example, doubling the size of a semiconductor die can more than double the fabrication cost.

DESCRIPTION OF THE DRAWINGS

FIG. 11 is a flowchart of one embodiment of a process of operating non-volatile memory that includes an integrated memory module.

FIG. 12 is a flowchart of one embodiment of a process of parallel programming in an integrated memory module.

DETAILED DESCRIPTION

Figure 1A:
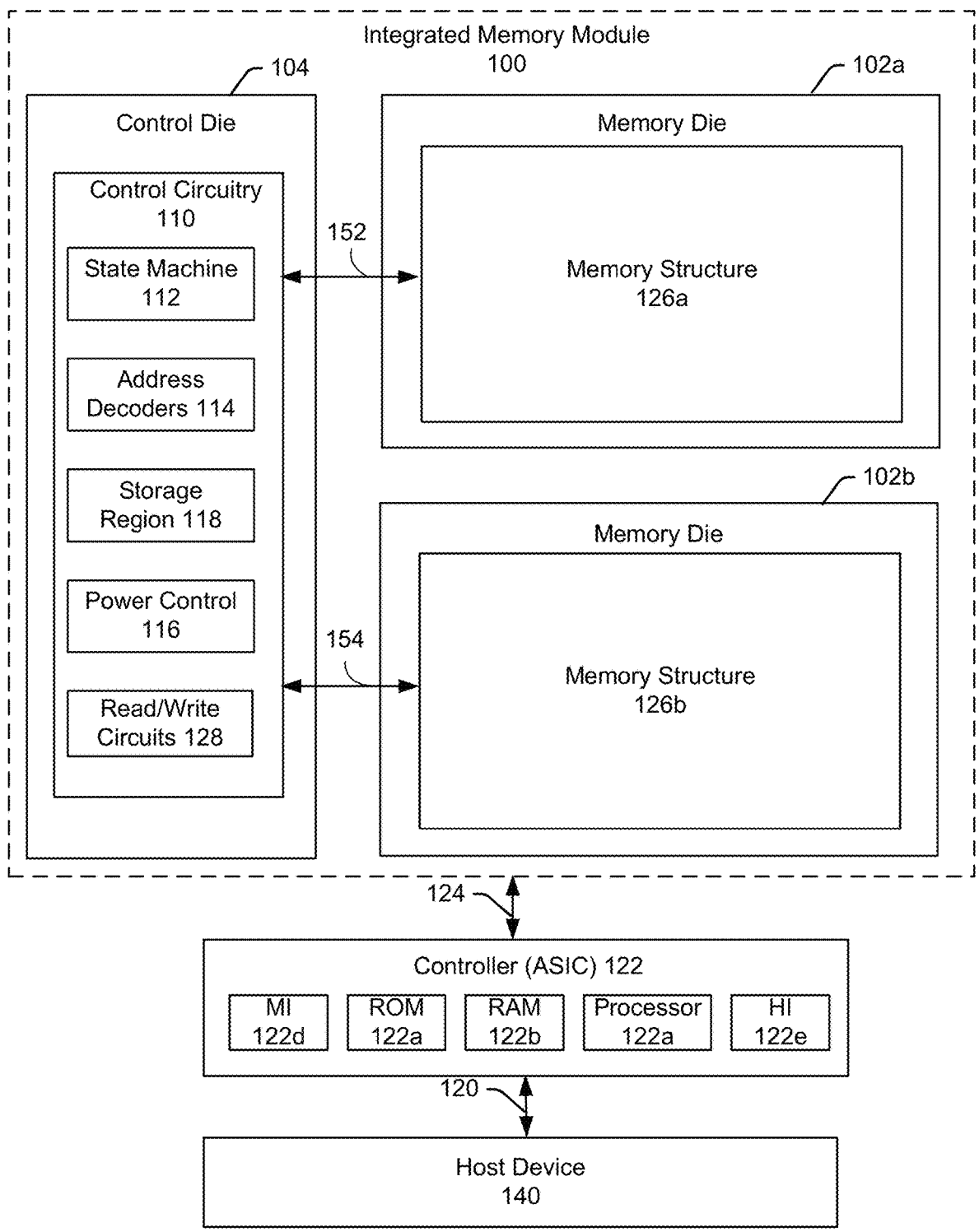
FIG. 1A is a functional block diagram of a memory device.

The present technology will now be described with reference to the figures, which in embodiments, relate to a semiconductor device including an integrated memory module. Embodiments of an integrated memory module have a high storage density, including areal density. Embodiments of an integrated memory module have high program and read throughput. Embodiments of an integrated memory module have high storage density (e.g., areal density) without sacrificing program or read throughput.

In some embodiments, the integrated memory module may include three semiconductor die, which together, operate as a single, integrated non-volatile memory. One semiconductor die may contain control circuitry, which may include sense amplifiers and drivers. Two semiconductor die may contain non-volatile memory cells. The three semiconductor die may be bonded together as a single, integrated non-volatile memory.

Embodiments of an integrated memory module described herein have a high storage density (e.g., areal density) without increasing semiconductor die size. Placing control circuitry on one of the semiconductor die may free up space on the two semiconductor die that contain the memory cells, such that additional memory cells may be placed on the memory cell die. Having two semiconductor die each with non-volatile memory cells may increase areal density of the integrated non-volatile memory. Moreover, the integrated non-volatile memory may increase the number of layers of memory cells without the problems associated with increasing the number of layers of memory cells on a single semiconductor die.

In general, program throughput may be increased by programming a greater number of memory cells in parallel. Likewise, read throughput may be increased by reading a greater number of memory cells in parallel. In some memory architectures, memory cells that are connected to the same word line may be programmed or read in parallel. One possible technique for increasing programming and/or read throughput is to increase the size of the word lines. However, this solution tends to increase the loading on the word lines, which can negatively impact performance. Embodiments of an integrated memory module described herein have a high programming throughput without significant increase of the size of the word lines. In some embodiments, a first group of memory cells connected to a first selected word line on a first semiconductor die are programmed in parallel with a second group of memory cells connected to a second selected word line on a second semiconductor die. Optionally, the same word line driver on a third semiconductor die may be used to provide the programming voltage to both the first and second selected word lines. Thus, programming throughput may be increased without significant increasing the size of the word lines. Moreover, programming throughput may be increased without significant increasing the loading on the word lines. Additionally, the first, second, and third semiconductor die are bonded together into an integrated memory device, in some embodiments. Therefore, the integrated memory device has both high programming throughout and high areal density.

Similarly, the first group of memory cells connected to the first selected word line on the first semiconductor die may be read in parallel with the second group of memory cells connected to the second selected word line on the second semiconductor die, in some embodiments. Thus, read throughput may be increased without significantly increasing the size of the word lines. Moreover, read throughput may be increased without significantly increasing the loading on the word lines. Additionally, the first, second, and third semiconductor die are bonded together into an integrated memory device, in some embodiments. Therefore, embodiments of an integrated memory device have both high read throughout and high areal density.

One possible way to increase the number of memory cells per die is to increase the number of blocks of memory cells in a plane. However, such a solution tends to increase the loading on the bit lines, which can impact performance. Embodiments of an integrated memory module described herein have high storage capacity, high programming throughput, and high read throughput, without increasing loading on bit lines.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a given dimension.

FIG. 1A-FIG. 4 describe one example of a memory system that can be used to implement the technology proposed herein. FIG. 1A is a functional block diagram of an example system that includes one embodiment of an integrated memory module 100. FIG. 1A also depicts a controller 122 and host device 140. The integrated memory module 100 includes three semiconductor die (or more succinctly, "die"), in an embodiment. First memory die 102a includes include memory structure 126a, and second memory die 102b includes memory structure 126b. Control die 104 includes a control circuitry 150. In some embodiments, the first memory die 102a, the second memory die 102b, and the control die 104 are bonded together, as will be described in more detail below.

The control circuitry 110 performs memory operations (e.g., write, read, erase and others) on memory structures 126. The control circuitry 110 includes state machine 112, an on-chip address decoder 114, a power control circuit 116, a storage region 118, and read/write circuits 128. In another embodiment, some of the read/write circuits 128 are located on first memory die 102a, and other read/write circuits 128 are located on second memory die 102b. In some embodiments, the control circuitry 110 is configured to control memory operations in memory structure 126a in parallel with memory operations in memory structure 126b. Herein, the term, "memory die," "memory semiconductor die," or the like, means a semiconductor die that contains non-volatile memory cells for storage. Herein, the term, "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

The on-chip address decoder 114 provides an address interface between addresses used by host 140 or controller 122 to the hardware address used by row decoders and column decoders (not expressly depicted in FIG. 1A). Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The power control circuit 116 executes under control of the state machine 112, in one embodiment.

The read/write circuits 128 includes sense blocks (which may contain sense amplifies (SA), in some embodiments. The sense amplifies include bit line drivers, in some embodiments. The read/write circuits 128 executes under control of the state machine 112, in one embodiment. Each memory structure 126 is addressable by word lines via a row decoder (not depicted in FIG. 1A) and by bit lines via a column decoder (not depicted in FIG. 1A), in some embodiments.

State machine 112 and/or controller 122 (or equivalently functioned circuits), in combination with all or a subset of the other circuits depicted in FIG. 1A, can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit. In some embodiments, the one or more control circuits are configured to control memory operations in memory structure 126a in parallel with memory operations in memory structure 126b.

Pathway 152 is a pathway between one or more components in the control circuitry 110 and the memory structure on memory die 102a. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. Pathway 152 allows the control circuitry 110 to provide voltages to word lines, select lines, and bit lines on memory die 102a, in one embodiment. Pathway 154 is a pathway between one or more components in the control circuitry 110 and the memory structure on memory die 102b. Pathway 154 allows the control circuitry 110 to provide voltages to word lines, select lines, and bit lines on memory die 102b, in one embodiment. Pathways 152, 154 may be used to receive signals from, for example, bit lines.

In some systems, a controller 122 is included in the same package (e.g., a removable storage card) as the integrated memory module 100. Note that there could be several integrated memory modules 100 in the same package with the controller 122. However, in other systems, the controller can be in a separate package from the integrated memory module 100. In an embodiment of FIG. 1A, the controller 122 is on a different die than the integrated memory module 100. In some embodiments, one controller 122 will communicate with multiple integrated memory modules 100. In other embodiments, each integrated memory module 100 has its own controller. Commands and data are transferred between a host 140 and controller 122 via a data bus 120, and between controller 122 and the one or more integrated memory modules 100 via lines 124. In one embodiment, integrated memory module 100 includes a set of input and/or output (I/O) pins that connect to lines 124. Lines 124 are depicted as being connected to integrated memory module 100 for generality. Lines 124 may connect to any or all of die 102a, 102b and/or 104. In one embodiment, lines 124 connect the controller 122 directly to memory die 104. In one embodiment, lines 124 connect the controller 122 directly to memory die 102a. In one embodiment, lines 124 connect the controller 122 directly to memory die 102a. If lines 124 connect the controller directly to either memory die 102a or 102b, then one of pathways 152 or 154 may be used to allow communication between the controller 122 and the control circuitry 110.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data. Memory interface 122d, in communication with ROM 122a, RAM 122b and processor 122c, is an electrical circuit that provides an electrical interface between controller 122 and one or more integrated memory modules 100. For example, memory interface 122d can change the format or timing of signals, provide a buffer, isolate from surges, latch I/O, etc. One or more processors 122c can issue commands to control circuitry 110 (or another component of integrated memory module 100) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

The storage device comprises code such as a set of instructions, and the processor is operable to execute the set of instructions to provide the functionality described herein. Alternatively or additionally, the processor can access code from a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or memory structure 126 for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

A control circuit can be configured to execute the instructions to perform the functions described herein.

Figure 1B:
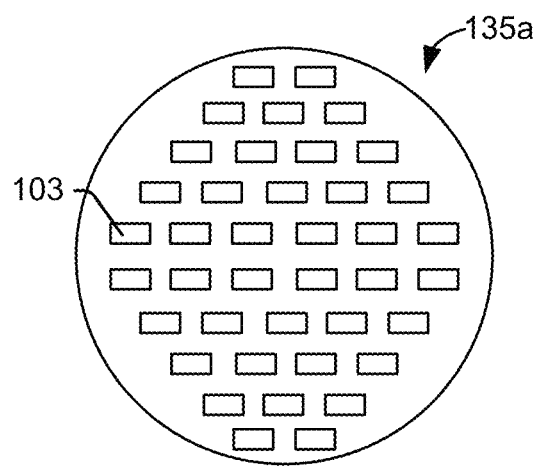
FIG. 1B is a top view of a semiconductor wafer from which multiple control semiconductor die are formed, according to embodiments of the present technology.

FIG. 1B is a top view of a semiconductor wafer 135a. The wafer 135a has numerous copies of integrated circuits 103. Each of the integrated circuits 103 contains the control circuitry 110 (see FIG. 1A), in one embodiment. The wafer 135a is diced into semiconductor dies, each containing one of the copies of the integrated circuits 103, in some embodiments. Therefore, numerous control semiconductor dies 104 may be formed from the wafer 135a. Also note that even before the wafer 135a is diced, as the term "control semiconductor die" is used herein, each region in which an integrated circuit 103 resides may be referred to as a control semiconductor die 104.

Figure 1C:
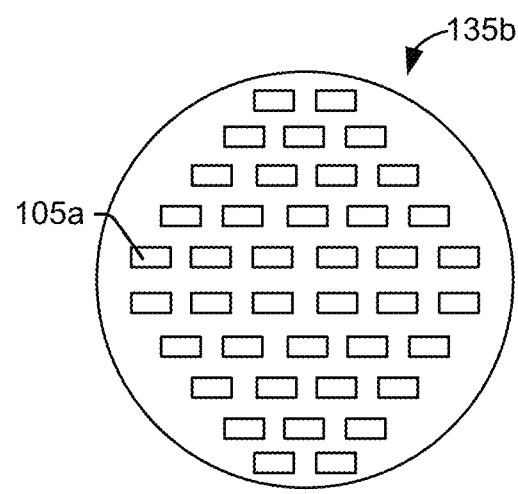
FIG. 1C is a top view of a semiconductor wafer from which multiple first memory semiconductor die are formed, according to embodiments of the present technology.

FIG. 1C is a top view of a semiconductor wafer 135b. The wafer 135b has numerous copies of integrated circuits 105a. Each of the integrated circuits 105a contains memory structure 126a (see FIG. 1A), in one embodiment. The wafer 135b is diced into semiconductor dies, each containing one of the copies of the integrated circuits 105a, in some embodiments. Therefore, numerous first memory semiconductor dies 102a may be formed from the wafer 135b. Also note that even before the wafer 135b is diced, as the term "memory semiconductor die" is used herein, each region in which an integrated circuit 105a resides may be referred to as a memory semiconductor die 102a.

Figure 1D:
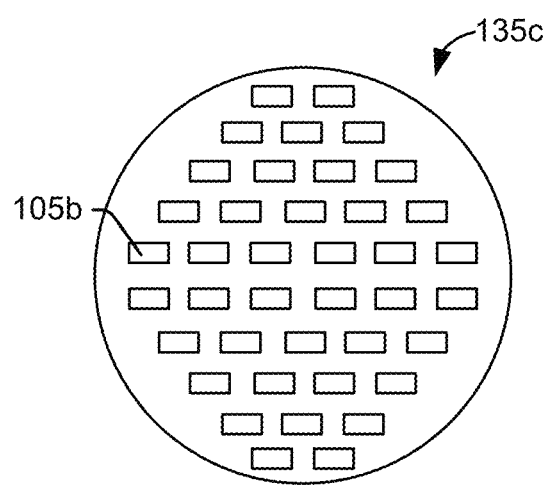
FIG. 1D is a top view of a semiconductor wafer from which multiple second memory semiconductor die are formed, according to embodiments of the present technology.

FIG. 1D is a top view of a semiconductor wafer 135c. The wafer 135c has numerous copies of integrated circuits 105b. Each of the integrated circuits 105b contains memory structure 126b (see FIG. 1A), in one embodiment. The wafer 135c is diced into semiconductor dies, each containing one of the copies of the integrated circuits 105b, in some embodiments. Therefore, numerous second memory semiconductor dies 102b may be formed from the wafer 135c. Also note that even before the wafer 135c is diced, as the term "memory semiconductor die" is used herein, each region in which an integrated circuit 105b resides may be referred to as a memory semiconductor die 102b.

The semiconductor wafers 135 may start as an ingot of monocrystalline silicon grown according to either a CZ, FZ or other process. The semiconductor wafers 135 may be cut and polished on major surfaces to provide smooth surfaces. The integrated circuits 103, 105a, 105b may be formed on and/or in the major surfaces. The dicing of the wafers 135 into semiconductor dies may occur before or after bonding. In one embodiment, the three wafers 135a, 135b, 135c are bonded together. After bonding the three wafers together, dicing is performed. Therefore, numerous integrated memory modules 100 may be formed from the three wafers 135. In another embodiment, the three wafers 135a, 135b, 135c are diced into semiconductor dies 104, 102a, 102b. Then, one of each of the semiconductor dies 104, 102a, 102b are bonded together to form an integrated memory module 100. Regardless of whether dicing occurs prior to or after bonding, it may be stated that the integrated memory module 100 contains a control semiconductor die 104, a first memory semiconductor die 102a, and a second memory semiconductor die 102b bonded together.

Figure 2A:
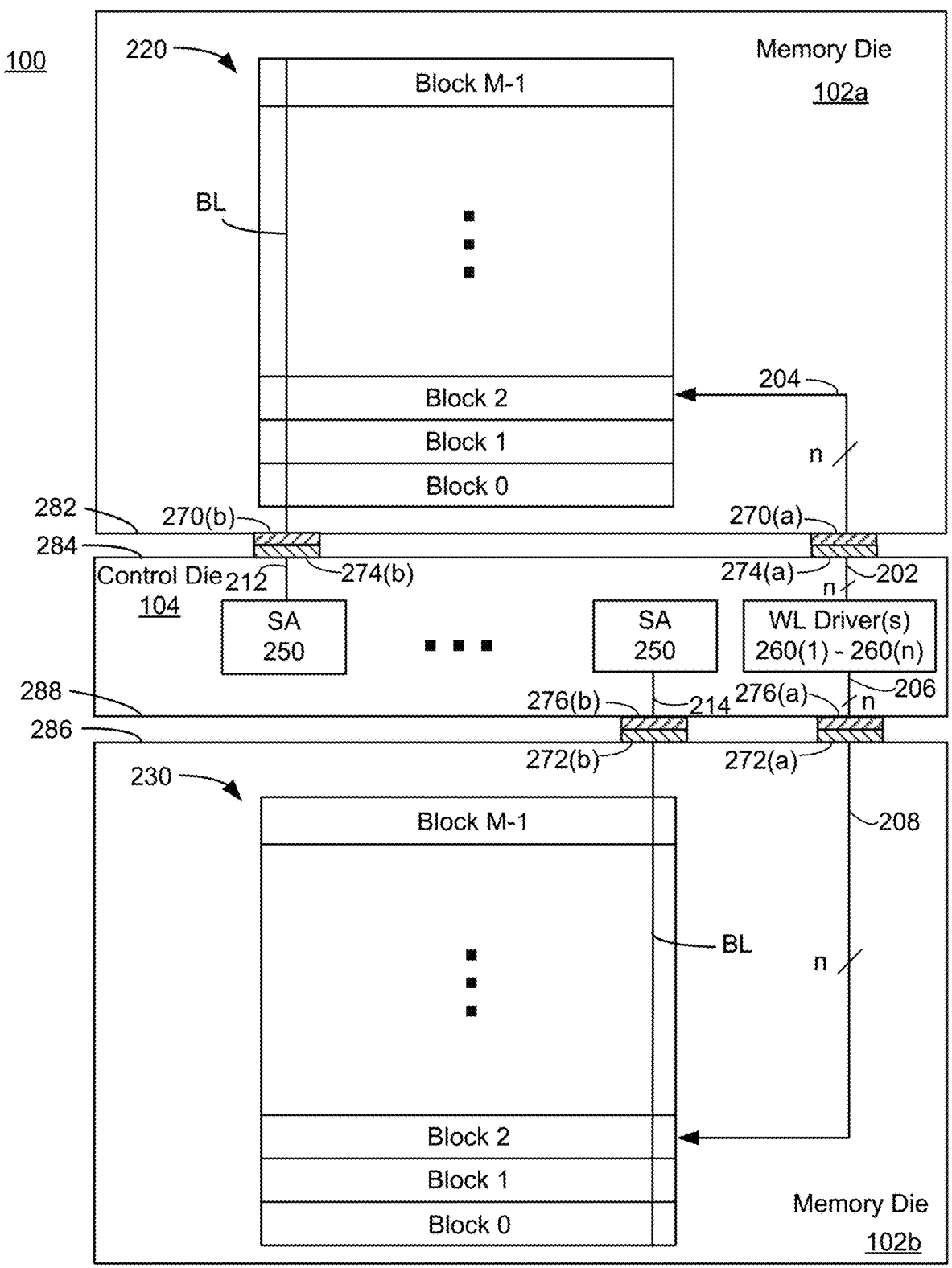
FIG. 2A is a block diagram of one embodiment of an integrated memory module.

FIG. 2A is a block diagram of one embodiment of an integrated memory module 100. Memory die 102a contains a first plane 220 of memory cells. Memory die 102b contains a second plane 230 of memory cells. Each memory die 102a, 102b may have additional planes. Each plane is divided into M blocks. In one example, each plane has about 2000 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 126 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 2A, Block 0 and Block M−1 of both planes 220 and 230 are at the edge of the memory structure (or otherwise referred to as being located in an edge region/section of the memory structure).

The control die 104 includes a number of sense amplifiers (SA) 250, in one embodiment. Each sense amplifier 250 is connected to one bit line, in this example. The sense amplifier contains a bit line driver, in one embodiment. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 104 includes a number of word line drivers 260(1)-260(n). The word line drivers 260 are configured to provide voltages to word lines. In this example, there are "n" word lines per block of memory cells. In one embodiment, one of the blocks in each plane 220, 230 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 260 provide voltages to the word lines in a first selected block (e.g., Block 2) in memory die 102a, and also for the word lines in a second selected block (e.g., Block 2) in memory die 102b. In some embodiments, a single word line driver concurrently provides the voltage for a first word line in memory die 102a and a second word line in memory die 102b. Therefore, the number of word line drivers 260 can be reduced.

The control die 104 may also include charge pumps, voltage generators, and the like, which may be used to provide voltages for the word line drivers 260 and/or the bit line drivers. The architecture in FIG. 2A permits such charge pumps, voltage generators and the like to generate voltages that are concurrently delivered to both memory die 102a, 102b.

The first memory die 102a has a number of bond pads 270(a), 270(b) on a first major surface 282 of first memory die 102a. There may be "n" bond pads 270(a), to receive voltages from a corresponding "n" word line drivers 260(1)-260(n). There may be one bond pad 270(b) for each bit line associated with plane 220. The reference numeral 270 will be used to refer in general to bond pads on major surface 282.

The control die 104 has a number of bond pads 274(a), 274(b) on a first major surface 284 of control die 104. There may be "n" bond pads 274(a), to deliver voltages from a corresponding "n" word line drivers 260(1)-260(n) to memory die 102a. There may be one bond pad 274b for each bit line associated with plane 220. The reference numeral 274 will be used to refer in general to bond pads on major surface 282. Note that there may be bond pad pairs 270(a)/

274(a) and bond pad pairs 270(b)/274(b). In some embodiments, bond pads 270 and/or 274 are flip-chip bond pads.

The control die 104 has a number of bond pads 276(a), 276(b) on a second major surface 288 of control die 104. There may be "n" bond pads 276(a) to deliver voltages from a corresponding "n" word line drivers 260(1)-260(n) to memory die 102b. There may be one bond pad 276b for each bit line associated with plane 230 on memory die 102b. The reference numeral 276 will be used to refer in general to bond pads on major surface 288.

The second memory die 102b has a number of bond pads 272(a), 272(b) on a first major surface 286 of second memory die 102b. There may be "n" bond pads 272(a), to receive voltages from a corresponding "n" word line drivers 260(1)-260(n). There may be one bond pad 272(b) for each bit line associated with plane 230. The reference numeral 272 will be used to refer in general to bond pads on major surface 286. Note that there may be bond pad pairs 272(a)/276(a) and bond pad pairs 272(b)/276(b). In some embodiments, bond pads 272 and/or 276 are flip-chip bond pads.

The pattern of bond pads 270 matches the pattern of bond pads 274, in one embodiment. Bond pads 270 are bonded (e.g., flip chip bonded) to bond pads 274, in one embodiment. Thus, the bond pads 270, 274 electrically and physically couple the first memory die 102a to the control die 104. Also, the bond pads 270, 274 permit internal signal transfer between the first memory die 102a and the control die 104. The pattern of bond pads 272 matches the pattern of bond pads 276, in one embodiment. Bond pads 272 are bonded (e.g., flip chip bonded) to bond pads 276, in one embodiment. Thus, the bond pads 272, 276 electrically and physically couple the second memory die 102b to the control die 104. Also, the bond pads 272, 276 permit internal signal transfer between the second memory die 102b and the control die 104. Thus, the first memory die 102a, the second memory die 102b, and the control die 104 are bonded together.

Herein, "internal signal transfer" means signal transfer between two of the dies 102(a), 102(b), 104. Internal signal transfer may be between control die 104 and first memory die 102(a) or between control die 104 and second memory die 102(b). Internal signal transfer, in some cases, is between first memory die 102(a) and second memory die 102(b). The internal signal transfer permits the circuitry on the control die 104 to control memory operations in the first the first memory die 102a in parallel with the second memory die 102b. Therefore, the bond pads 270, 272, 274, 276 may be used for memory operation signal transfer. Herein, "memory operation signal transfer" refers to any signals that pertain to a memory operation in a memory die 102. A memory operation signal transfer could include, but is not limited to, providing a voltage, providing a current, receiving a voltage, receiving a current, sensing a voltage, and/or sensing a current.

The bond pads 270-276 may be formed for example of copper, aluminum and alloys thereof. There may be a liner between the bond pads 272-278 and the major surfaces (282-288). The liner may be formed for example of a titanium/titanium nitride stack. The bond pads 270-276 and liner may be applied by vapor deposition and/or plating techniques. The bond pads and liners together may have a thickness of 720 nm, though this thickness may be larger or smaller in further embodiments.

Figure 6:
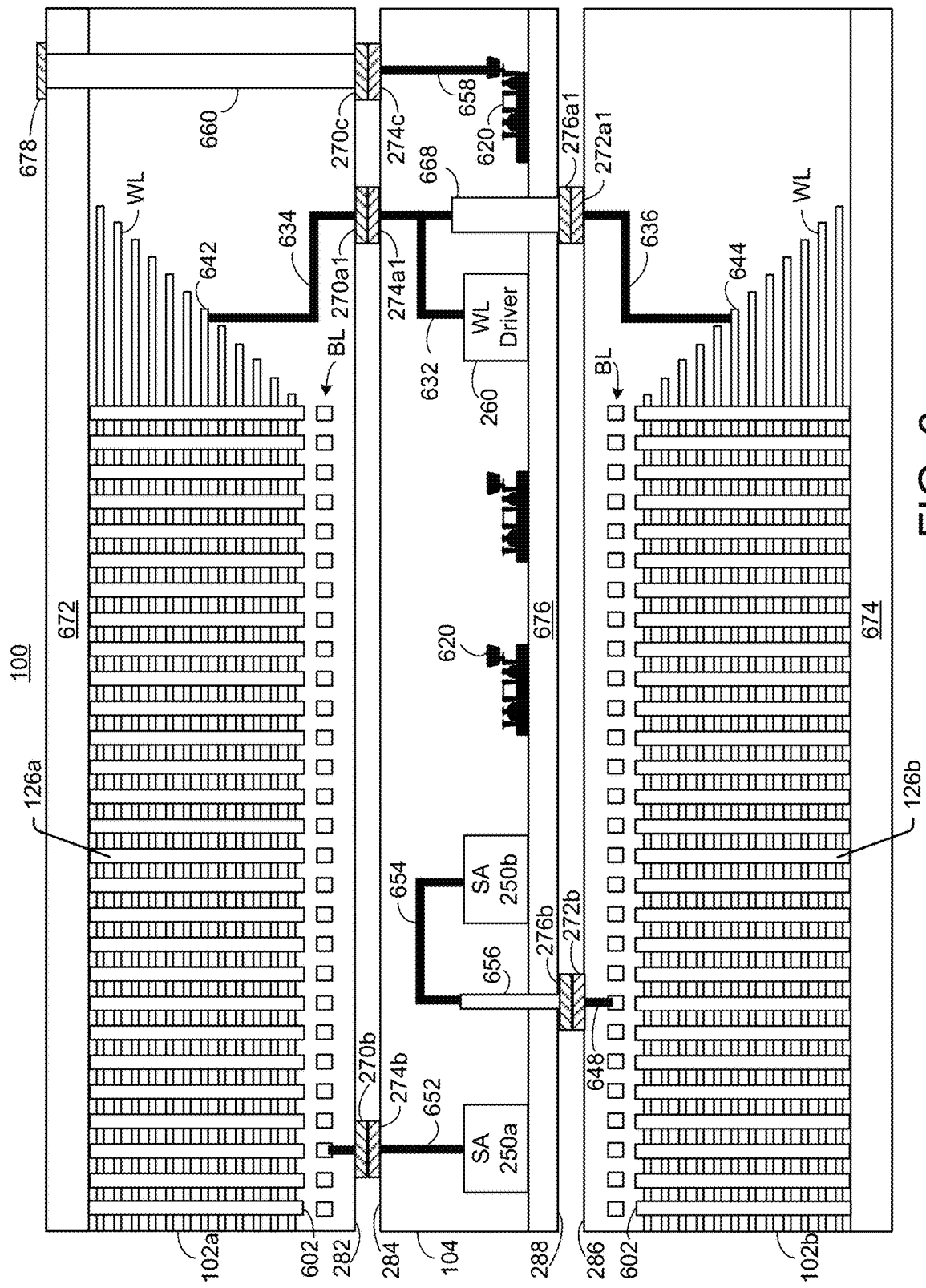
FIG. 6 is a diagram showing details of one embodiment of an integrated memory module.

Metal interconnects and/or vias may be used to electrically connect various elements in the dies to the bond pads 270-276. Several conductive pathways, which may be implemented with metal interconnects and/or vias are depicted. For example, a sense amplifier 250 may be electrically connected to bond pad 274(b) by pathway 212, or to bond pad 276(b) by pathway 214. There may be thousands of such sense amplifiers, pathways, and bond pads. The word line drivers 260 may be electrically connected to bond pads 274(a) by pathways 202. Note that pathways 202 may comprise a separate conductive pathway for each word line driver 260(1)-260(n). Likewise, there may be a separate bond pad 274(a) for each word line driver 260(1)-260(n). The word lines in block 2 of memory die 102a may be electrically connected to bond pads 270(a) by pathways 204. The word lines in block 2 of memory die 102b may be electrically connected to bond pads 272(a) by pathways 208. In FIG. 2A, there are "n" pathways 204 and "n" pathways 208, for a corresponding "n" word lines in a block. Likewise, there may be "n" word line drivers 260, "n" pathways 202, and "n" pathways 206. There may be a separate pair of bond pads 270(a), 274(a) for each pathway 204. There may be a separate pair of bond pads 272(a), 276(a) for each pathway 208. FIG. 6 depicts further details of one embodiment of an integrated memory module 100 having metal interconnects and/or vias.

Figure 2B:
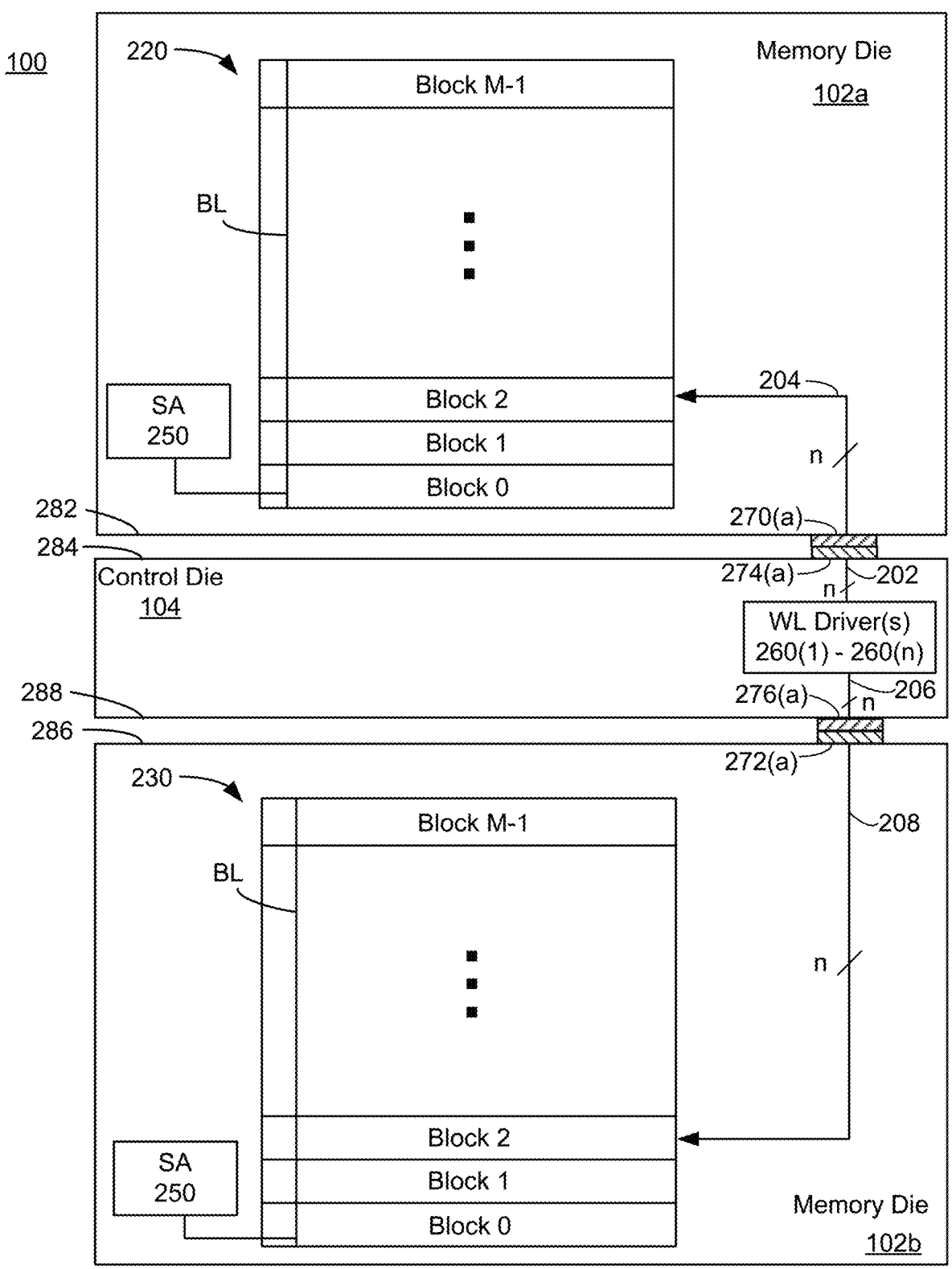
FIG. 2B is a block diagram of another embodiment of an integrated memory module.

FIG. 2B depicts another embodiment of an integrated memory module 100. The sense amplifiers (SA) 250 are located on the first memory die 102a, and the second memory die 102b in an embodiment depicted in FIG. 2B. Thus, bond pads 270(b), 272(b), 274(b), and 276(b) are not necessary in an embodiment of the integrated memory module 100. However, there could be other bond pads in addition to the bond pads 270(a), 272(a), 274(a), and 276(a). Thus, bond pads 270, 274 electrically and physically couple the first memory die 102a to the control die 104. Also, the bond pads 270(a), 274(a) permit internal signal transfer between the first memory die 102a and the control die 104. Furthermore, bond pads 272, 276 electrically and physically couple the second memory die 102b to the control die 104. Also, the bond pads 272(a), 276(a) permit internal signal transfer between the first memory die 102a and the control die 104.

Figure 3A:
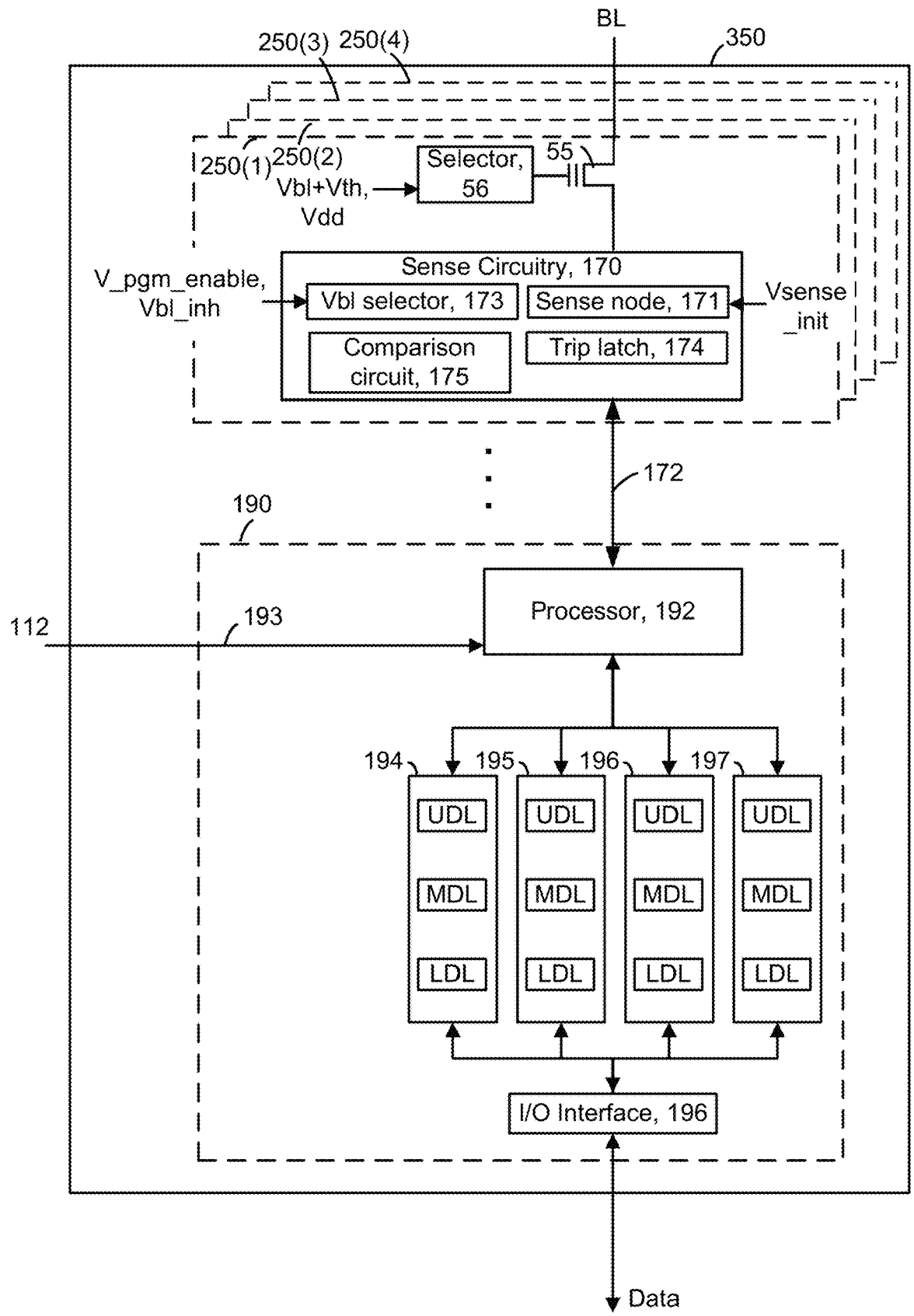
FIG. 3A is a block diagram depicting one embodiment of a sense block.

FIG. 3A is a block diagram depicting one embodiment of a sense block 350. The read/write circuits 128 contain numerous sense blocks, in some embodiments. An individual sense block 350 is partitioned into one or more core portions, referred to as sense circuits 250(1)-250(4) or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 250(1), as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program enable voltage (e.g., Vpgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel. Hence, in one embodiment, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vt (e.g., 1 V). For example, if Vbl+Vt is passed by the selector 56, the bit line voltage will be Vbl. This assumes the source line is at 0 V. The transistor 55 clamps the bit line voltage according to the control gate voltage and acts as a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense circuitry 170 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194, 195, 196, 197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a middle page of data, and UDL stores a bit for an upper page of data. This is in an eight-level or three-bits per memory cell memory device.

A page of data is a unit of data that is programmed at a given time. In one embodiment, one page of data is programmed into a portion of one block. For example, the page may be programmed into memory cells connected to a selected word line in a block. In other embodiments, one page may be programmed across multiple blocks. For example, a first portion of the page may be programmed into memory cells connected to a first selected word line in a first block on first memory die 102a, and a second portion of the page may be programmed into memory cells connected to a second selected word line in a second block on second memory die 102b. The exact size of a page, the exact size of a block, all vary based on the particular implementation. In one example, a page stores 2048 bits of data, a page of data is stored in two blocks with 1024 bits of data in each block, and the two blocks storing a page of data are in different memory dies 102a, 102b.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

The processor 192 may also be used to determine what voltage to apply to the bit line, based on the state of the latches. This may be used to manage the magnitude and/or length of time that a weak program enable voltage is applied to the bit line.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 250. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3B:
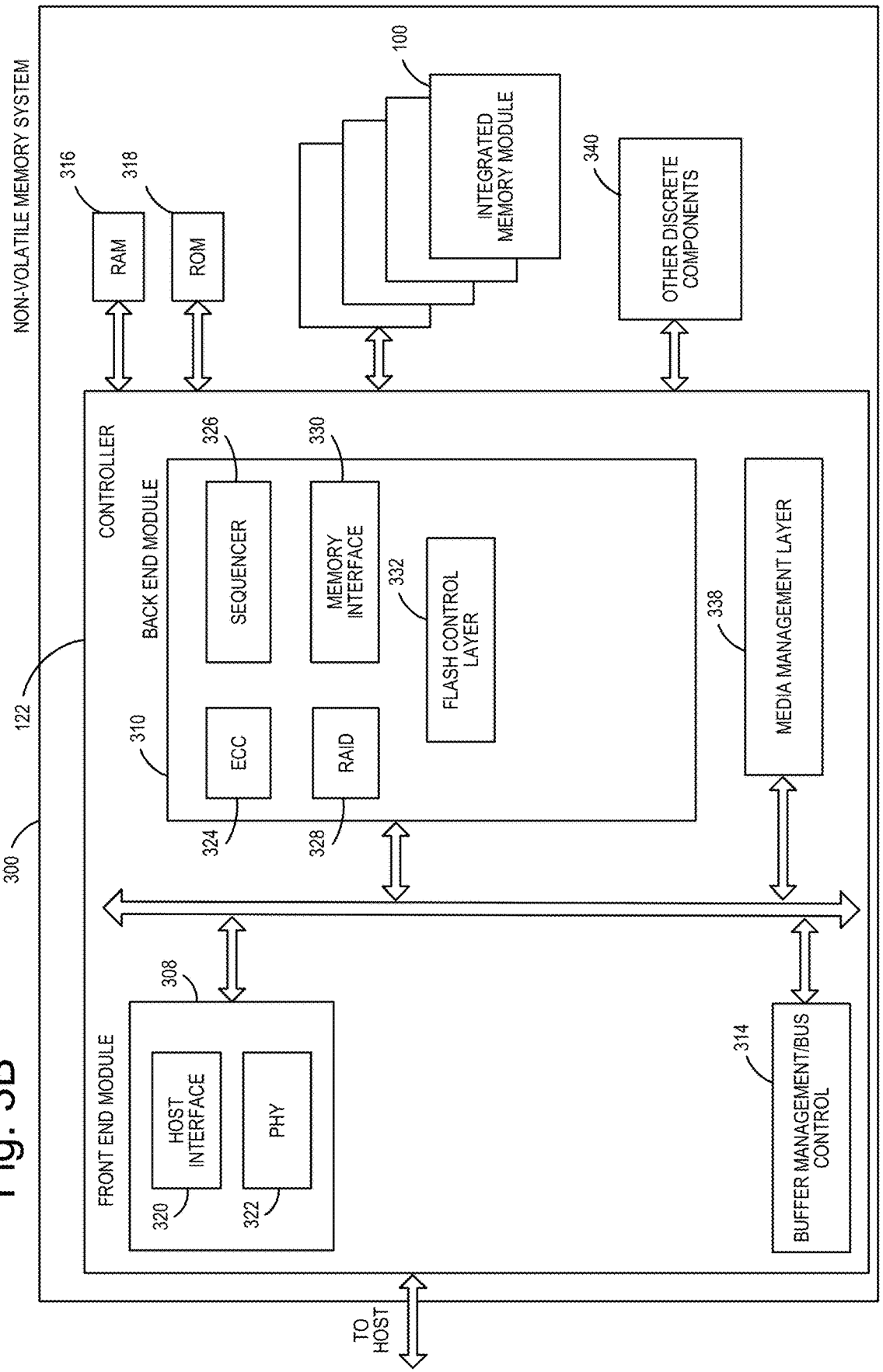
FIG. 3B is a block diagram depicting one embodiment of a memory system.

FIG. 3B is a block diagram of example memory system 300, depicting more details of one embodiment of controller 122. The controller in FIG. 3B is a flash memory controller, but note that the integrated memory module 100 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and integrated memory module 100 may be any suitable flash interface, such as Toggle Mode 200, 400, or 800. In one embodiment, memory system 300 may be a card-based system, such as a secure digital (SD) or a micro secure digital (micro-SD) card. In an alternate embodiment, memory system 300 may be part of an embedded memory system. For example, the flash memory may be embedded within the host. In other example, memory system 300 can be in the form of a solid state drive (SSD).

In some embodiments, non-volatile memory system 300 includes a single channel between controller 122 and integrated memory module 100, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The memory cells on an integrated memory module 100 can be arranged in one or more planes. In one embodiment, memory operations are performed in parallel on groups of memory cells on different planes on the same memory die. In one embodiment, memory operations are performed in parallel on groups of memory cells on different planes on different memory die in the same integrated memory module 100. In one embodiment, memory operations are performed in parallel on groups of memory cells on different integrated memory modules 100.

As depicted in FIG. 3B, controller 122 includes a front end module 308 that interfaces with a host, a back end module 310 that interfaces with the one or more integrated memory modules 100, and various other modules that perform functions which will now be described in detail.

The components of controller 122 depicted in FIG. 3B may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3B is one example implementation that may (or may not) use the components of controller 122 depicted in FIG. 1A (i.e. RAM, ROM, processor, interface).

Referring again to modules of the controller 122, a buffer manager/bus control 314 manages buffers in random access memory (RAM) 316 and controls the internal bus arbitration of controller 122. A read only memory (ROM) 318 stores system boot code. Although illustrated in FIG. 3B as located separately from the controller 122, in other embodiments one or both of the RAM 316 and ROM 318 may be located within the controller. In yet other embodiments, portions of RAM and ROM may be located both within the controller 122 and outside the controller. Further, in some implementations, the controller 122, RAM 316, and ROM 318 may be located on separate semiconductor die.

Front end module 308 includes a host interface 320 and a physical layer interface (PHY) 322 that provide the electrical interface with the host or next level storage controller. The choice of the type of host interface 320 can depend on the type of memory being used. Examples of host interfaces 320 include, but are not limited to, SATA, SATA Express, SAS, Fibre Channel, USB, PCIe, and NVMe. The host interface 320 typically facilitates transfer for data, control signals, and timing signals.

Back end module 310 includes an error correction code (ECC) engine 324 that encodes the data bytes received from the host, and decodes and error corrects the data bytes read from the non-volatile memory. In some embodiments, the ECC engine 324 calculates parity bits for each unit of data (e.g., page) that is being stored at one time. The parity bits (also referred to as an error correction code) may be stored with the unit of data (e.g., page). In one embodiment, the parity bits are stored remotely from the unit of data (e.g., page). In one embodiment, the controller 122 instructs an integrated memory module 100 to program a first portion of a page on a first memory die 102a in parallel with programming a second portion of the page on a second memory die 102b. The parity bits for the page may be stored on either memory die 102a, 102b; split between the memory dies 102a, 102b; or stored elsewhere. In one embodiment, the controller 122 instructs an integrated memory module 100 to program a first page on a first memory die 102a in parallel with programming a second page on a second memory die 102b. The parity bits for the first page may be stored on first memory die 102a, and the parity bits for the second page may be stored on second memory die 102b. Alternatively, the parity bits for the first and second pages may be stored elsewhere.

A command sequencer 326 generates command sequences, such as program and erase command sequences, to be transmitted to integrated memory module 100. A RAID (Redundant Array of Independent Dies) module 328 manages generation of RAID parity and recovery of failed data. The RAID parity may be used as an additional level of integrity protection for the data being written into the non-volatile memory system 300. In some cases, the RAID module 328 may be a part of the ECC engine 324. Note that the RAID parity may be added as an extra die or dies as implied by the common name, but it may also be added within the existing die, e.g. as an extra plane, or extra block, or extra WLs within a block. A memory interface 330, which is configured to be connected to integrated memory module 100, provides the command sequences to integrated memory module 100, and receives status information from integrated memory module 100. In one embodiment, memory interface 330 may be a double data rate (DDR) interface, such as a Toggle Mode 200, 400, or 800 interface. A flash control layer 232 controls the overall operation of back end module 210.

Additional components of system 300 illustrated in FIG. 3B include media management layer 338, which performs wear leveling of memory cells of integrated memory module 100. System 300 also includes other discrete components 340, such as external electrical interfaces, external RAM, resistors, capacitors, or other components that may interface with controller 122. In alternative embodiments, one or more of the physical layer interface 322, RAID module 328, media management layer 338 and buffer management/bus controller 314 are optional components that are not necessary in the controller 122.

The Flash Translation Layer (FTL) or Media Management Layer (MML) 338 may be integrated as part of the flash management that may handle flash errors and interfacing with the host. In particular, MML may be a module in flash management and may be responsible for the internals of NAND management. In particular, the MML 338 may include an algorithm in the memory device firmware which translates writes from the host into writes to the memory 126 of integrated memory module 100. The MML 338 may be needed because: 1) the memory may have limited endurance; 3) the memory 126 may only be written in multiples of pages; and/or 3) the memory 126 may not be written unless it is erased as a block (or a tier within a block in some embodiments). The MML 338 understands these potential limitations of the memory 126 which may not be visible to the host. Accordingly, the MML 338 attempts to translate the writes from host into writes into the memory 126.

Controller 122 may interface with one or more integrated memory modules 100. In one embodiment, controller 122 and multiple integrated memory modules 100 (together comprising non-volatile storage system 300) implement a solid state drive (SSD), which can emulate, replace or be used instead of a hard disk drive inside a host, as a NAS device, in a laptop, in a tablet, in a server, etc. Additionally, the SSD need not be made to work as a hard drive.

One or more of ECC 324, sequencer 326, RAID 328, flash control layer 332, media management layer 338, and/or buffer management/bus control 314 may be referred to as a processor circuit. The processor circuit can include hardware only or a combination of hardware and software (including firmware). For example, a controller programmed by firmware to perform the functions described herein is one example of a control circuit. A processor circuit can include a processor, PGA (Programmable Gate Array, FPGA (Field Programmable Gate Array), ASIC (Application Specific Integrated Circuit), integrated circuit or other type of circuit.

Some embodiments of a non-volatile storage system will include one integrated memory module 100 connected to one controller 122. However, other embodiments may include multiple integrated memory modules 100 in communication with one or more controllers 122. In one example, the integrated memory modules 100 can be grouped into a set of memory packages. Each memory package includes one or more integrated memory modules 100 in communication with controller 122. In one embodiment, a memory package includes a printed circuit board (or similar structure) with one or more integrated memory modules 100 mounted thereon. In some embodiments, a memory package can include molding material to encase the memory dies of the memory package. In some embodiments, controller 122 is physically separate from any of the memory packages.

Figure 4:
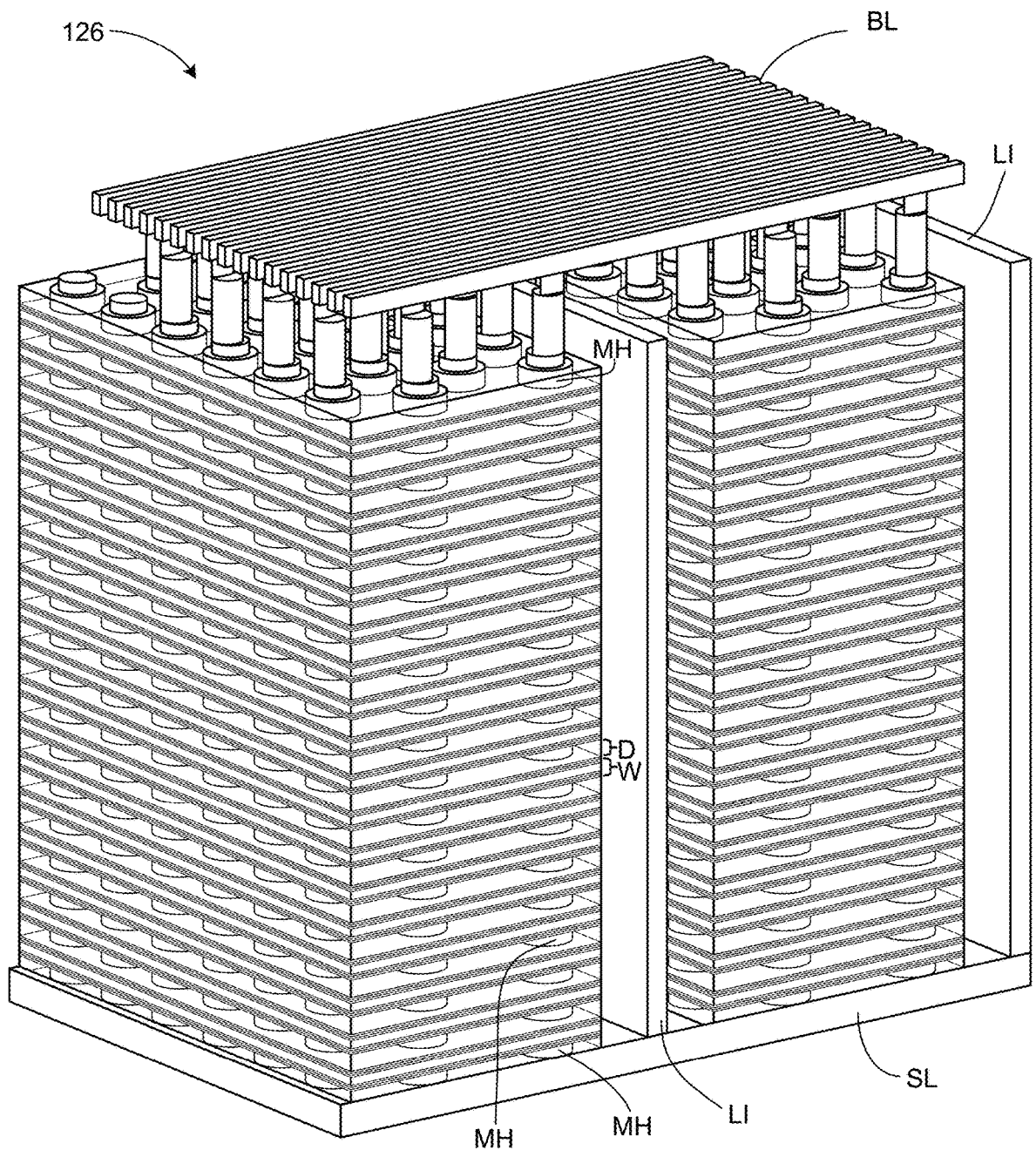
FIG. 4 is a perspective view of a portion of one example embodiment of a monolithic three dimensional memory array.

FIG. 4 is a perspective view of a portion of one example embodiment of a monolithic three dimensional memory array that can comprise memory structure 126, which includes a plurality non-volatile memory cells. For example, FIG. 4 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or fewer than 108-300 layers can also be used. The alternating dielectric layers and conductive layers are divided into four "fingers" or sub-blocks by local interconnects LI, in an embodiment. FIG. 4 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 5:
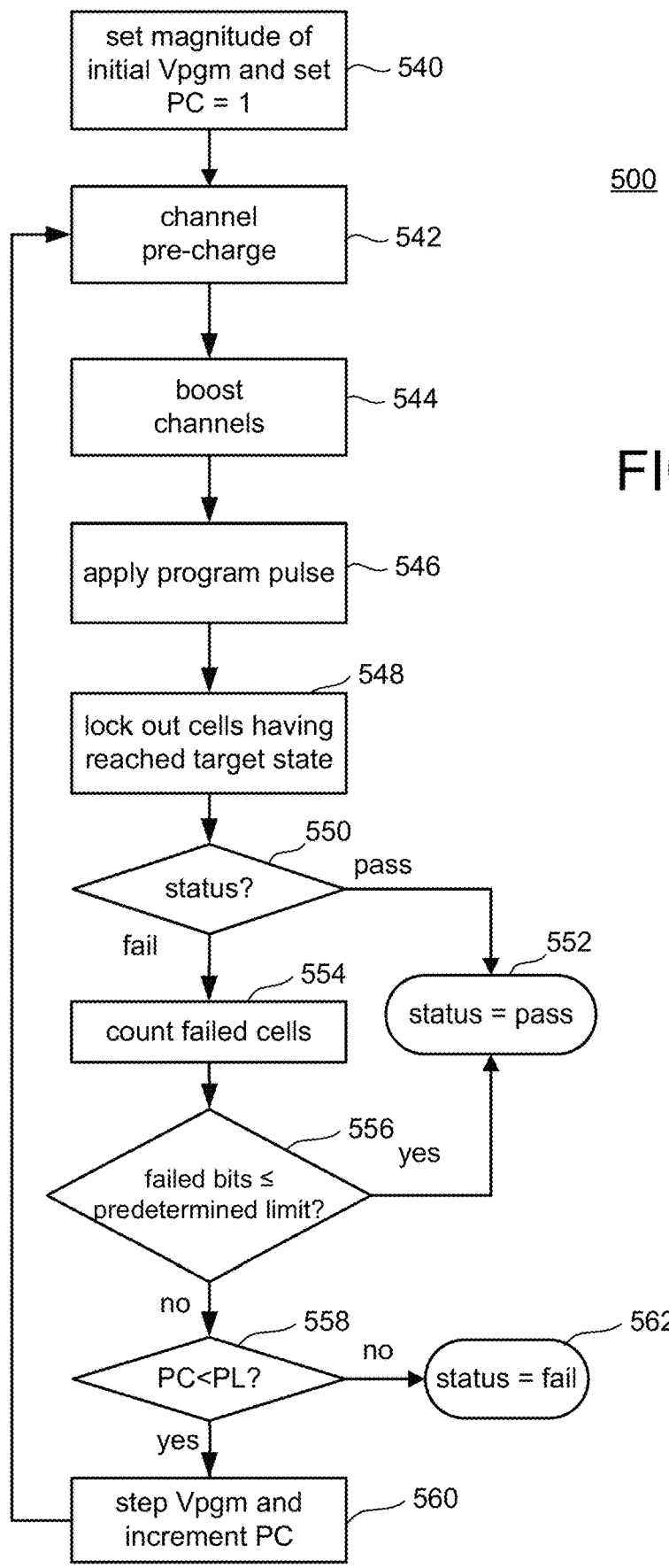
FIG. 5 is a flowchart describing one embodiment of a process for programming NAND strings of memory cells organized into an array.

FIG. 5 is a flowchart describing one embodiment of a process 500 for programming NAND strings of memory cells organized into an array. In one example embodiment, the process of FIG. 5 is performed on first memory die 102a in parallel with second memory die 102b using the control circuitry 110 on the control die 104. For example, the process of FIG. 5 can be performed at the direction of state machine 112 on the control die 104.

Typically, the program voltage applied to the control gates (via a selected word line) during a program operation is applied as a series of program pulses. Between at least some of the programming pulses are a set of verify pulses to perform verification. Not all states are verified after a program pulse, in some embodiments. In many implementations, the magnitude of the program pulses is increased with each successive pulse by a predetermined step size. In step 540 of FIG. 5, the programming voltage (Vpgm) is initialized to the starting magnitude (e.g., ~12-16V or another suitable level) and a program counter PC maintained by state machine 112 is initialized at 1.

In one embodiment, the group of memory cells selected to be programmed (referred to herein as the selected memory cells) are programmed concurrently and comprise first memory cells connected to a first selected word line in memory die 102a and second memory cells connected to a second selected word line in memory die 102b. There will likely be other memory cells that are not selected for programming (unselected memory cells) that are also connected to the first and second selected word lines. That is, the selected word lines will also be connected to memory cells that are supposed to be inhibited from programming. For example, when data is written to a set of memory cells, some of the memory cells will need to stay in an erased state, so they will not be programmed. Additionally, as memory cells reach their intended target data state, they will be inhibited from further programming. Those NAND strings (e.g., unselected NAND strings) that include memory cells connected to a selected word line that are to be inhibited from programming have their channels boosted to inhibit programming. When a channel has a boosted voltage, the voltage differential between the channel and the word line is not large enough to cause programming. To assist in the boosting, in step 542 the memory system will pre-charge channels of NAND strings that include memory cells connected to the selected word line that are to be inhibited from programming.

In step 544, NAND strings that include memory cells connected to the selected word line(s) that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 546, a program pulse of the program signal Vpgm is applied to the selected word line(s). If a memory cell on a NAND string should be programmed, then the corresponding bit line is biased at a program enable voltage, in one embodiment. Herein, such a NAND string is referred to as a "selected NAND string."

In step 546, the program pulse is concurrently applied to all memory cells connected to the selected word line(s) so that all of the memory cells connected to the selected word line are programmed concurrently (unless they are inhibited from programming). For example, a word line driver 260 on the control die 104 is used to provide the program pulse to both the first selected word line in the first memory die 102a and the second selected word line in the second memory die 102b. Thus, the memory cells connected to the first selected word line are programmed concurrently with the memory cells connected to the second selected word line. Therefore, programming throughput is high. Moreover, word line loading is kept low due to the first and second selected word lines being on separate memory die 102a, 102b.

In step 548, memory cells that have reached their target states are locked out from further programming. Step 548 may include performing verifying at one or more verify reference levels. In one embodiment, the verification process is performed by testing whether the threshold voltages of the memory cells selected for programming have reached the appropriate verify reference voltage. In step 548, a memory cell may be locked out after the memory cell has been verified (by a test of the Vt) that the memory cell has reached its target state.

If, in step 550, it is determined that all of the memory cells have reached their target threshold voltages (pass), the programming process is complete and successful because all selected memory cells were programmed and verified to their target states. A status of "PASS" is reported in step 552. Otherwise if, in step 550, it is determined that not all of the memory cells have reached their target threshold voltages (fail), then the programming process continues to step 554.

In step 554, the memory system counts the number of memory cells that have not yet reached their respective target threshold voltage distribution. That is, the system counts the number of memory cells that have, so far, failed to reach their target state. This counting can be done by the state machine, the controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 556, it is determined whether the count from step 554 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 552. In this situation, enough memory cells programmed correctly such that the few remaining memory cells that have not been completely programmed can be corrected using ECC during the read process. In some embodiments, the predetermined limit used in step 556 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 558 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 562. If the program counter PC is less than the program limit value PL, then the process continues at step 560 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 560, the process loops back to step 542 and another program pulse is applied to the selected word line so that another iteration (steps 542-560) of the programming process of FIG. 5 is performed.

FIG. 6 is a diagram of one embodiment of an integrated memory module 100. In an embodiment depicted in FIG. 6, first memory die 102*a* is bonded to control die 104, and control die 104 is bonded to second memory die 102*b*. Thus, the first, second and third semiconductor die are bonded together. This bonding configuration is similar to an embodiment depicted in FIG. 2A. Note that although a gap is depicted between the pairs of adjacent dies, such a gap may be filled with an epoxy or other resin or polymer (see, FIG. 9, for example).

Each memory die 102*a*, 102*b* includes a memory structure 126. Memory structure 126*a* is adjacent to substrate 672 of memory die 102*a*. Memory structure 126*b* is adjacent to substrate 674 of memory die 102*b*. The substrates 672, 674 are formed from a portion of a silicon wafer, in some embodiments. In this example, the memory structures 126 each include a three-dimensional memory array. The memory structures 126 have a similar structure as the example depicted in FIG. 4. There are a number of word line layers (WL), which are separated by dielectric layers. The dielectric layers are represented by gaps between the word line layers. Thus, the word line layers and dielectric layers form a stack. There may be many more word line layers than are depicted in FIG. 6. As with the example of FIG. 4, there are a number of columns that extend through the stack. One column 602 is referred to in each stack with reference numeral 602. The columns contain memory cells. For example, each column may contain a NAND string. There are a number of bit lines (BL) adjacent to the stack.

Word line driver 260 concurrently provides voltages to a first word line 642 in memory die 102*a* and a second word line 644 in memory die 102*b*. The pathway from the word line driver 260 to the first word line 642 includes conductive pathway 632, bond pad 274*a*1, bond pad 270*a*1, and conductive pathway 634. The pathway from the word line driver 260 to the second word line 644 includes conductive pathway 632, through silicon via (TSV) 668, bond pad 276*a*1, bond pad 272*a*1, and conductive pathway 636. Conductive pathways 632, 634, and 636 may each include one or more vias (which may extend vertically with respect to the major surfaces of the die) and one or more metal interconnects (which may extend horizontally with respect to the major surfaces of the die). Conductive pathways 632, 634, and 636 may include transistors or other circuit elements. In one embodiment, the transistors may be used to, in effect, open or close the pathway. Therefore, the same word line driver 260 may be used to concurrently provide a voltage to both the first word line 642 and the second word line 644. Other word line drivers (not depicted in FIG. 6) provide voltages to other word lines. Thus, there are additional bond pad 274*a*, 270*a* in addition to bond pads 274*a*1, 270*a*1. Likewise, there are additional bond pad 276*a*, 272*a* in addition to bond pads 276*a*1, 272*a*1. As is known in the art, the bond pads may be formed for example of copper, aluminum and alloys thereof.

Sense amplifier 250*a* is in communication with a bit line in memory die 102*a*. The pathway from the sense amplifier 250*a* to the bit line includes conductive pathway 652, bond pad 274*b*, bond pad 270*b*, and conductive pathway 634. Sense amplifier 250*b* is in communication with a bit line in memory die 102*b*. The pathway from the sense amplifier 250*b* to the bit line includes conductive pathway 654, TSV 656, bond pad 276*b*, bond pad 272*b*, and conductive pathway 648. Conductive pathways 652, 654, and 648 may each include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 652, 654, 648 may include transistors or other circuit elements. In one embodiment, the transistors may be used to, in effect, open or close the pathway.

The control die 104 has a substrate 676, which may be formed from a silicon wafer. The sense amplifiers 250, word line driver(s) 260, and other circuitry 620 may be formed on and/or in the substrate 676. The circuitry 620 may include some or all of the control circuitry 110 (see FIG. 1A). In some embodiments, sense amplifiers 250, word line driver(s) 260, and/or other circuitry 620 comprise CMOS circuits.

There is an external signal path that allows circuitry on the control die 104 to communicate with an entity external to the integrated memory module 100. Therefore, circuitry 620 on the control die 104 may communicate with, for example, controller 122 (see FIG. 1A). Optionally, circuitry on the control die 104 may communicate with, for example, host 140. The external pathway includes via 658 in control die 104, bond pad 274c, bond pad 270c, through silicon via (TSV) 660, and external pad 678. The TSV 660 extends through substrate 672.

The TSVs 656, 660, may be formed before, during or after formation of the integrated circuits in the semiconductor dies 102, 104. The TSVs may be formed by etching holes through the wafers. For example, holes may be etched through substrates 672, 676. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modification to an embodiment depicted in FIG. 6 are possible. One modification is for sense amplifiers 250a to be located on first memory die 102a, and for sense amplifiers 250b to be located on second memory die 102b.

Figure 7:
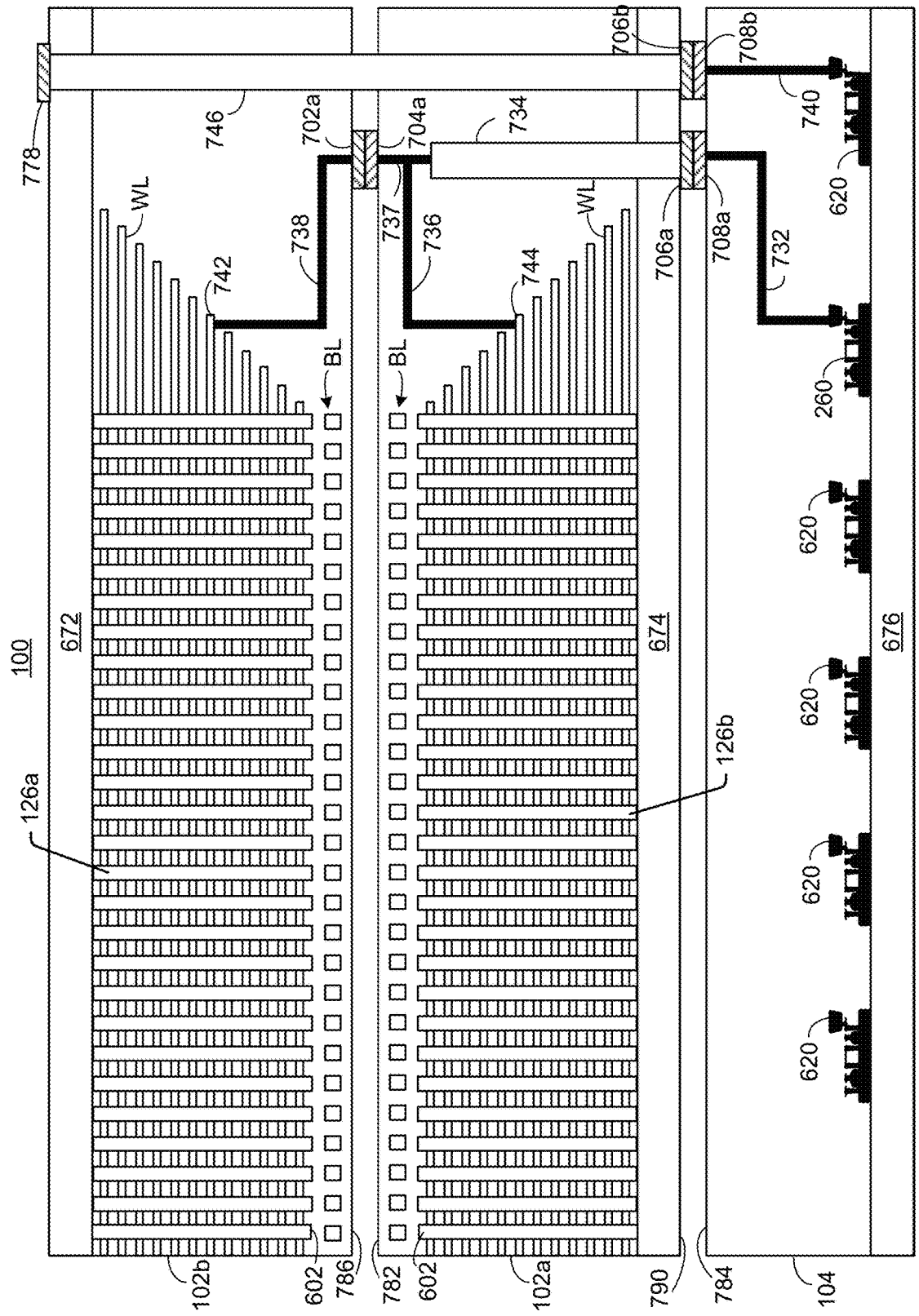
FIG. 7 is a diagram showing details of another embodiment of an integrated memory module.

FIG. 7 is a diagram of one embodiment of an integrated memory module 100. In an embodiment depicted in FIG. 7, first memory die 102a is bonded to second memory die 102b, and first memory die 102a is bonded to control die 104. Specifically, bond pads 702 on first major surface 786 of second memory die 102b are bonded to bond pads 704 on first major surface 782 of first memory die 102a. Also, bond pads 706 on second major surface 790 of first memory die 102a are bonded to bond pads 708 on first major surface 784 of control die 104. Thus, the first, second and third semiconductor die are bonded together. Note that there may be many other bond pads than are depicted in FIG. 7. Also, note that although a gap is depicted between the pairs of adjacent dies, such a gap may be filled with an epoxy or other resin or polymer (see, FIG. 10, for example). In some embodiments, bond pads 702, 704, 706 and/or 708 are flip-chip bond pads.

There is an internal signal path that allows the word line drivers 260 on the control die 104 to deliver voltages to word lines in the memory dies 102a, 102b. The internal signal pathway includes pathway 732 in control die 104, bond pad 708a, bond pad 706a, TSV 734, and pathway 736 to word line 744 in first memory die 102a. The internal signal path further includes pathway 737, bond pad 704a, bond pad 702a, and pathway 738 to word line 742 in second memory die 102b. The TSV 734 extends through substrate 674.

There is an external signal path that allows circuitry 620 on the control die 104 to communicate with an entity external to the integrated memory module 100. Therefore, circuitry 620 on the control die 104 may communicate with, for example, controller 122 (see FIG. 1A). Optionally, circuitry on the control die 104 may communicate with, for example, host 140. The external pathway includes via 740 in control die 104, bond pad 708b, bond pad 706b, through silicon via (TSV) 746, and external pad 778. The TSV 746 extends through substrate 674.

Numerous modification to an embodiment depicted in FIG. 7 are possible. One modification is for sense amplifiers 250 to be located on control die 104.

Figure 8:
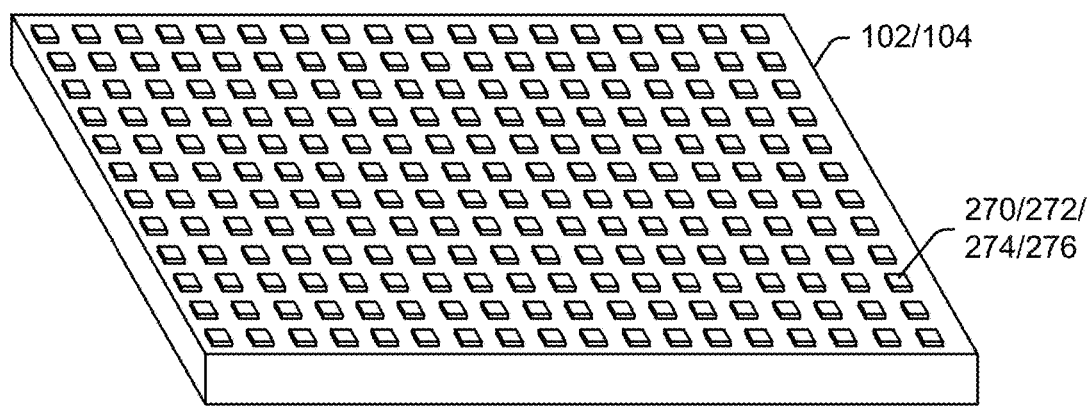
FIG. 8 depicts an example pattern of bond pads on a planar surface of a semiconductor die.

FIG. 8 depicts an example pattern of bond pads on a planar surface of a semiconductor die. The semiconductor die could be any of first memory die 102a, second memory die 102b, or control die 104. The bond pads could be any of bond pads 270, 272, 274, or 276, as appropriate for the semiconductor die. Alternatively, the bond pads could be any of bond pads 702, 704, 706, or 708 (see, FIG. 7). There may be many more bond pads than are depicted in FIG. 8. As one example, 100,000 or more interconnections may be required between two of the semiconductor die. In order to support such large numbers of electrical interconnections, the bond pads may be provided with a small area and pitch. some embodiments, the bond pads are flip-chip bond pads.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 3 μm to 5 μm. While this process is referred to herein as Cu-to-Cu bonding, this term may also apply even where the bond pads are formed of materials other than Cu.

When the area of bond pads is small, it may be difficult to bond the second semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 3 μm square and spaced from each other with a pitch of 1 μm to 5 μm. Bonding techniques may be used providing bond pads with even smaller sizes and pitches.

As noted above, some embodiments may include a film on surface of the dies 102, 104. Where no such film is initially provided, a space between the dies may be under filled with an epoxy or other resin or polymer. The under-fill material may be applied as a liquid which then hardens into a solid layer. This under-fill step protects the electrical connections between the dies 102, 104, and further secures the dies together. Various materials may be used as under-fill material, but in embodiments, it may be Hysol epoxy resin from Henkel Corp., having offices in California, USA.

The semiconductor dies 102, 104 in the integrated memory module 100 may be bonded to each other by initially aligning the bond pads on the respective dies 102, 104 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 102 and 104. In some embodiments, the bonding of the dies 102a, 102b, 104 is performed prior to dicing the wafers. Thus, several wafers 135a, 135b, 135c may be bonded together, and then diced. In some embodiments, the bonding of the dies 102a, 102b, 104 is performed after dicing the wafers.

Figure 9:
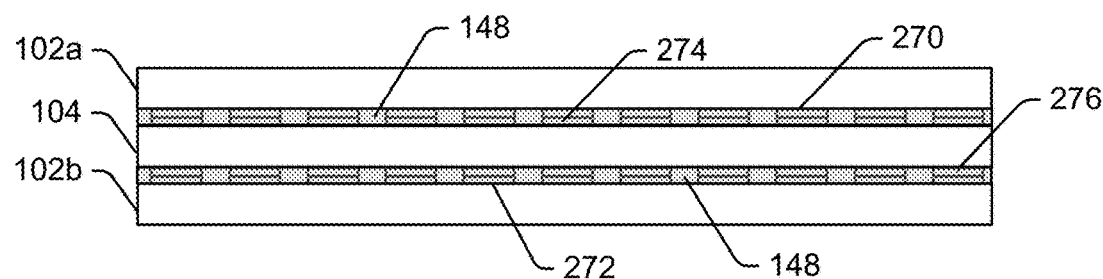
FIG. 9 depicts a side view of an embodiment of an integrated memory module consistent with an embodiment of FIG. 6.

FIG. 9 depicts a side view of an embodiment of an integrated memory module 100. The integrated memory module 100 is consistent with the examples of FIGS. 2A and 6. The first memory die 102a is depicted as bonded to the control die 104, and the control die 104 is depicted as bonded to the second memory die 102b. Thus, the first memory die 102a, the second memory die 102b and the control die 104 are bonded together. Some of the bond pads 270, 272, 274, and 276 are depicted. There may be many more bond pads. A space between the dies 102, 104 is filled with a solid layer 148, which may be formed from the aforementioned epoxy or other resin or polymer.

Figure 10:
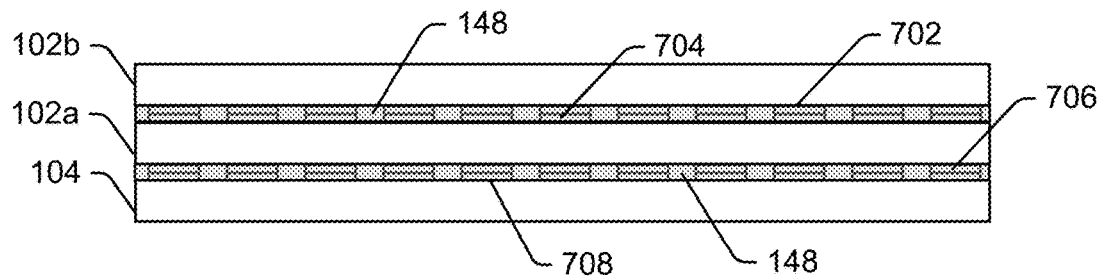
FIG. 10 depicts a side view of an embodiment of an integrated memory module consistent with an embodiment of FIG. 7.

FIG. 10 depicts a side view of an embodiment of an integrated memory module 100. The integrated memory module 100 is consistent with the examples of FIG. 7. The first memory die 102a is depicted as bonded to the second memory die 102b, and the control die 104 is depicted as bonded to the first memory die 102a. Thus, the first memory die 102a, the second memory die 102b and the control die 104 are bonded together. Some of the bond pads 702, 704, 706, and 708 are depicted. There may be many more bond pads. A space between the dies 102, 104 is filled with a solid layer 148, which may be formed from the aforementioned epoxy or other resin or polymer.

FIG. 11 is a flowchart of one embodiment of a process 1100 of operating non-volatile memory that includes an integrated memory module 100. The process 1100 may be used to perform a memory operation in parallel in first memory die 102a, and second memory 102b. The memory operation may be program, read, or erase. Process 1100 may use any of the internal signal paths described herein in order to transfer signals (e.g., voltages, currents) between dies 102(a), 102(b), 104, but is not limited to the examples described herein.

Step 1102 includes providing a set of memory operation voltages from the control semiconductor die 104 through first pairs of bond pads to a first selected block in a first three-dimensional array of non-volatile memory cells on first semiconductor die 102a. The first pads of bond pads electrically and physically couple the first semiconductor die to the second semiconductor die.

In one embodiment consistent with FIG. 6, step 1102 includes providing voltages from WL drivers 260(1)-260(n) on control die 104 through bond pad pairs 272(a)/276(a) to word lines in a selected block in first memory die 102a. The voltages include a voltage to a selected word line and voltages to unselected word lines, in some embodiments.

In another embodiment consistent with FIG. 7, step 1102 includes providing voltages from WL driver 260(1)-260(n) on control die 104 through bond pad pairs 708(a)/706(a) to word lines in a selected block in first memory die 102a. The voltages include a voltage to a selected word line and voltages to unselected word lines, in some embodiments.

Step 1104 includes providing the set of memory operation voltages from the control semiconductor die 104 through second pairs of bond pads to a second selected block in a second three-dimensional array of non-volatile memory cells on second memory semiconductor die 102(b). The set of memory operation voltages are provided to the first memory die 102(a) and the second memory die 102(b) in parallel in order to control memory operations in parallel in the first selected block and the second selected block.

In one embodiment consistent with FIG. 6, step 1104 includes providing voltages from the WL drivers 260(1)-260(n) on the control die 104 through bond pad pairs 276(a)/272(a) to word lines in a selected block in the second memory die 102b. The voltages include a voltage to a selected word line and voltages to unselected word lines, in some embodiments.

In another embodiment consistent with FIG. 7, step 1104 includes providing voltages from WL driver 260(1)-260(n) on control die 104 through bond pad pairs 704(a)/702(a) to word lines in a selected block in second memory die 102b. The voltages include a voltage to a selected word line and voltages to unselected word lines, in some embodiments.

In one embodiment consistent with FIG. 6, the second set pairs of bond pads electrically and physically couple the control die 104 to the second memory die 102b. In one embodiment consistent with FIG. 7, the second pairs of bond pads electrically and physically couple the first memory die 102a to the second memory die 102b.

FIG. 12 is a flowchart of one embodiment of a process 1200 of parallel programming in an integrated memory module. The process 1200 may be used to program a first set of memory cells on the first memory die 102a in parallel with a second set of memory cells on the second memory 102b. Process 1200 may use any of the internal signal paths described herein in order to transfer signals (e.g., voltages, currents) between dies 102(a), 102(b), 104, but is not limited to the examples described herein. In some embodiments, even though memory cells on the first memory die 102a are programmed in parallel with memory cells on the second memory die 102b, the control die 104 may erase the memory cells on the first memory die 102a independent of the memory cells on the second memory die 102b.

Step 1202 includes receiving a unit of data at the control die 104. The process can be used to program one bit per memory cell, or multiple bits per memory cell. In one embodiment in which one bit is programmed per memory cell, the unit of data is a page of data. In this case, a first portion of the page is programmed into memory cells on first memory die 102a and a second portion of the page is programmed into memory cells on second memory die 102b. In one embodiment in which one bit is programmed per memory cell, the unit of data unit is two pages of data. In this case, the first page is programmed into memory cells on first memory die 102a and the second page is programmed into memory cells on second memory die 102b.

The concept of either programming a whole page or a partial page to each memory die 102 may be extended to cases in which multiple bits are programmed per memory cell. When programming two bits per memory cell, two full pages are programmed in memory cells on the first memory die 102a, and two full pages are programmed in memory cells on the second memory die 102b, in one embodiment. When programming two bits per memory cell, two partial pages are programmed in memory cells on the first memory die 102a, and two partial pages are programmed in memory cells on the second memory die 102b, in one embodiment. Note that the page sizes may be larger in the partial page example.

Step 1204 includes transferring a portion (e.g., half) of the data to latches in sense amplifiers 250 that are associated with memory die 102a. The sense amplifiers are located on the control die 104. As noted above, this portion of the data could be an entire page or a portion of a page. Step 1204 may also include transferring parity bits for the page to the latches in sense amplifiers 250.

Step 1206 includes transferring a portion (e.g., half) of the data to latches in sense amplifiers 250 that are associated with memory die 102b. The sense amplifiers are located on the control die 104. Step 1206 may also include transferring parity bits for the page to the latches in sense amplifiers 250.

Step 1208 includes applying one or more program voltages to a first selected word line in the first memory die 102*a* concurrently with applying the one or more program voltages to a second selected word line in the second memory die 102*b*. The program voltages are provided by the same word line driver on the control die 104, in one embodiment. Thus, process 1200 is one embodiment of controlling memory operations in parallel on memory cells in the first memory die 102(*a*) and the second memory die 102(*b*).

Figure 13:
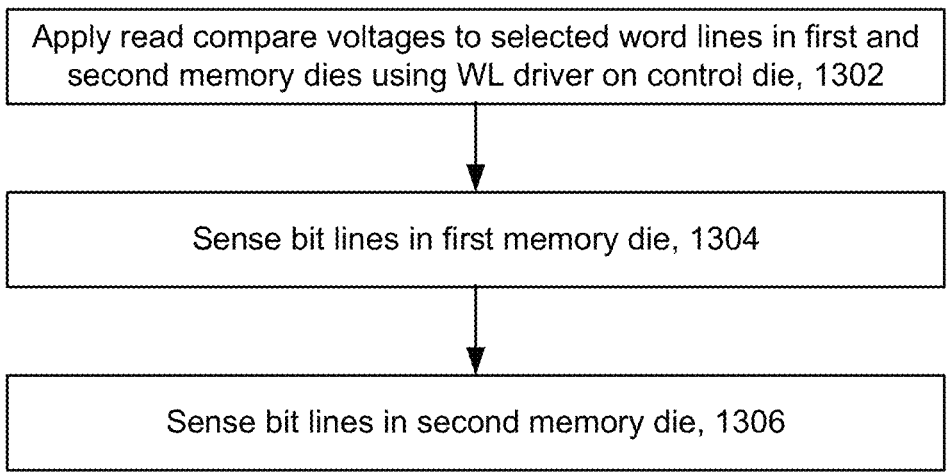
FIG. 13 is a flowchart of one embodiment of a process of parallel sensing in an integrated memory module.

FIG. 13 is a flowchart of one embodiment of a process 1300 of parallel sensing in an integrated memory module. The process 1300 may be used to sense a first set of memory cells on the first memory die 102*a* in parallel with a second set of memory cells on the second memory 102*b*. The sense operation is are read operation, in one embodiment. The sense operation is a program verify, in one embodiment. Process 1300 may use any of the internal signal paths described herein in order to transfer signals (e.g., voltages, currents) between dies 102(*a*), 102(*b*), 104, but is not limited to the examples described herein.

Step 1302 includes using a WL driver 260 to apply one or more read compare voltages to a first selected word line in the first memory die 102*a* in parallel with applying the one or more read compare voltages to a second selected word line in the second memory die 102*b*. The WL driver 260 is located on the control die 104, in an embodiment.

Step 1304 includes sensing bit lines in the first memory die 102*a* using a first set of sense amplifiers 250 on the control die 104. Step 1304 includes sensing bit lines of a first selected block in the first memory die 102(*a*) through the bond pads 270*b*, in one embodiment. Step 1304 includes sensing bit lines of the first selected block in the first memory die 102(*a*) through the bond pads 274*b*, in one embodiment. Step 1304 includes sensing bit lines of the first selected block in the first memory die 102(*a*) through bond pads 270*b* and bond pads 274*b*, in one embodiment.

Step 1306 includes sensing bit lines in the second memory die 102*b* using a second set of sense amplifiers 250 on the control die 104. Step 1306 includes sensing bit lines of a second selected block in the second memory die 102(*b*) through the bond pads 272*b*, in one embodiment. Step 1306 includes sensing bit lines of the second selected block in the second memory die 102(*b*) through the bond pads 276*b*, in one embodiment. Step 1306 includes sensing bit lines of the second selected block in the second memory die 102(*b*) through bond pads 272*b* and bond pads 276*b*, in one embodiment.

Steps 1304 and 1306 are performed in parallel. Thus, process 1300 is one embodiment of controlling memory operations in parallel on memory cells in the first memory die 102(*a*) and the second memory 102(*b*).

A first embodiment includes an apparatus comprising a first semiconductor die comprising first non-volatile memory cells, a second semiconductor die comprising second non-volatile memory cells, and a third semiconductor die comprising control circuitry. The first, the second and the third semiconductor die are bonded together. The control circuitry is configured to control memory operations in the first memory cells in parallel with the second memory cells.

In a second embodiment, in furtherance of the first embodiment, the control circuitry is further configured to program data into a first group of the first non-volatile memory cells connected to a first word line in the first semiconductor die in parallel with programming data into a second group of the second non-volatile memory cells connected to a second word line in the second semiconductor die.

In a third embodiment, in furtherance of the first or second embodiment, the control circuitry is further configured to program a first portion of a page into the first group in parallel with programming a second portion of the page into the second group.

In a fourth embodiment, in furtherance of any of the first to third embodiments, the control circuitry is further configured to read data from memory cells connected to a first word line in the first semiconductor die in parallel with reading data from memory cells connected to a second word line in the second semiconductor die.

In a fifth embodiment, in furtherance of any of the first to fourth embodiments, the control circuitry comprises circuitry configured to provide a voltage for a memory operation to both the first semiconductor die and the second semiconductor die.

In a sixth embodiment, in furtherance of any of the first to fifth embodiments, the third semiconductor die is bonded to the first semiconductor die; and the third semiconductor die is bonded to the second semiconductor die.

In a seventh embodiment, in furtherance of any of the first to fifth embodiments, the third semiconductor die is bonded to the first semiconductor die; and the first semiconductor die is bonded to the second semiconductor die.

In an eighth embodiment, in furtherance of any of the first to seventh embodiments, the control circuitry comprises: a first plurality of sense amplifiers connected to first bit lines on the first semiconductor die through a first group of bond pads; and a second plurality of sense amplifiers connected to second bit lines on the second semiconductor die through a second group of bond pads.

In a ninth embodiment, in furtherance of any of the first to eighth embodiments, the control circuitry comprises: a word line driver connected to a first word line on the first semiconductor die and to a second word line on the second semiconductor die. The control circuitry is configured to control the word line driver to concurrently deliver a voltage to the first word line and to the second word line.

In a tenth embodiment, in furtherance of any of the first to sixth, eighth or ninth embodiments, the first semiconductor die comprises a first group of bond pads; the second semiconductor die comprises a second group of bond pads; the third semiconductor die comprises a third group of bond pads bonded to the first group of bond pads to electrically and physically couple the third semiconductor die to the first semiconductor die and to permit internal signal transfer between the first semiconductor die and the third semiconductor die; and the third semiconductor die comprises a fourth group of bond pads bonded to the second group of bond pads to electrically and physically couple the third semiconductor die to the second semiconductor die and to permit internal signal transfer between the second semiconductor die and the third semiconductor die.

In an eleventh embodiment, in furtherance of any of the first to fifth, or seventh to ninth embodiments, the first semiconductor die comprises a first group of bond pads; the second semiconductor die comprises a second group of bond pads; the third semiconductor die comprises a third group of bond pads bonded to the first group of bond pads to electrically and physically couple the third semiconductor die to the first semiconductor die and to permit internal signal transfer between the first semiconductor die and the third semiconductor die; and the first semiconductor die further comprises a fourth group of bond pads bonded to the second group of bond pads to electrically and physically couple the second semiconductor die to the first semiconductor die and to permit internal signal transfer between the second semiconductor die and the first semiconductor die.

An embodiment includes a method of operating non-volatile memory. The method comprises providing a set of memory operation voltages from a control semiconductor die through first pairs of bond pads to a first selected block in a first three-dimensional array of non-volatile memory cells on a first memory semiconductor die. The first pairs of bond pads electrically and physically couple the control semiconductor die to the first memory semiconductor die. The method also includes providing the set of memory operation voltages from the control semiconductor die through second pairs of bond pads to a second selected block in a second three-dimensional array of non-volatile memory cells on a second memory semiconductor die. The set of memory operation voltages are provided to the first memory semiconductor die and the second memory semiconductor die in parallel in order to control memory operations in parallel in the first selected block and the second selected block. The second pairs of bond pads electrically and physically couple either the control semiconductor die to the second memory semiconductor die or the first memory semiconductor die to the second memory semiconductor die.

An embodiment includes integrated memory module, comprising a first semiconductor die comprising a first three-dimensional array of non-volatile memory cells, a second semiconductor die comprising a second three-dimensional array of non-volatile memory cells, a third semiconductor die comprising control circuitry configured to control memory operations in the first three-dimensional array in parallel with the second three-dimensional array. The integrated memory module further comprises first pairs of bond pads configured to electrically and physically couple the first semiconductor die to the third semiconductor die. The first pairs of bond pads configured to permit memory operation signal transfer between the first semiconductor die and the third semiconductor die. The integrated memory module further comprises second pairs of bond pads configured to electrically and physically couple either the second semiconductor die to the third semiconductor die or electrically and physically couple the first semiconductor die to the second semiconductor die. The second pairs of bond pads configured to further configured to permit memory operation signal transfer either between the second semiconductor die and the third semiconductor die or between the first semiconductor die and the second semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:
1. An apparatus, comprising:
a first semiconductor die comprising a first group of non-volatile memory cells and a first word line, wherein the first group of memory cells is connected to the first word line;
a second semiconductor die comprising a second group of non-volatile memory cells and a second word line, wherein the second group of memory cells is connected to the second word line; and
a third semiconductor die comprising control circuitry, the third semiconductor die is bonded to the first semiconductor die, the third semiconductor die is bonded to the second semiconductor die, the control circuitry configured to program a first portion of a page into the first group of memory cells in parallel with programming a second portion of the page into the second group of memory cells.

2. The apparatus of claim 1, wherein the control circuitry is further configured to:
read data from memory cells connected to a first word line in the first semiconductor die in parallel with reading data from memory cells connected to a second word line in the second semiconductor die.

3. The apparatus of claim 1, wherein the control circuitry comprises:
circuitry configured to provide a voltage for a memory operation to both the first semiconductor die and the second semiconductor die.

4. The apparatus of claim 1, wherein the control circuitry comprises:
a first plurality of sense amplifiers connected to first bit lines on the first semiconductor die through a first group of bond pads; and
a second plurality of sense amplifiers connected to second bit lines on the second semiconductor die through a second group of bond pads.

5. The apparatus of claim 1, wherein the control circuitry comprises:
a word line driver connected to the first word line on the first semiconductor die and to the second word line on the second semiconductor die, the control circuitry configured to control the word line driver to concurrently deliver a voltage to the first word line and to the second word line.

6. The apparatus of claim 1, wherein:
the first semiconductor die comprises a first group of bond pads;
the second semiconductor die comprises a second group of bond pads;
the third semiconductor die comprises a third group of bond pads bonded to the first group of bond pads to electrically and physically couple the third semiconductor die to the first semiconductor die and to permit internal signal transfer between the first semiconductor die and the third semiconductor die; and
the third semiconductor die comprises a fourth group of bond pads bonded to the second group of bond pads to electrically and physically couple the third semiconductor die to the second semiconductor die and to permit internal signal transfer between the second semiconductor die and the third semiconductor die.

7. A method of operating non-volatile memory, the method comprising:
providing a set of memory operation voltages from a control semiconductor die through first pairs of bond pads to a first selected block in a first three-dimensional array of non-volatile memory cells on a first memory semiconductor die, the first pairs of bond pads electrically and physically couple the control semiconductor die to the first memory semiconductor die, providing the set of memory operation voltages to the first selected block includes providing a voltage from a word line driver on the control semiconductor die to a first selected word line in the first selected block; and providing the set of memory operation voltages from the control semiconductor die through second pairs of bond pads to a second selected block in a second three-dimensional array of non-volatile memory cells on a second memory semiconductor die, providing the set of memory operation voltages to the second selected block includes providing the voltage from the word line driver on the control semiconductor die to a second selected word line in the second selected block, the set of memory operation voltages provided to the first memory semiconductor die and the second memory semiconductor die in parallel in order to control memory operations in parallel in the first selected block and the second selected block, the second pairs of bond pads electrically and physically couple either the control semiconductor die to the second memory semiconductor die or the first memory semiconductor die to the second memory semiconductor die.

8. The method of claim 7, further comprising:
sensing first bit lines of the first selected block in the first memory semiconductor die through the first pairs of bond pads; and
sensing second bit lines of the second selected block in the second memory semiconductor die through the second pairs of bond pads.

9. An integrated memory module, comprising:
a first semiconductor die comprising a first three-dimensional array of non-volatile memory cells, the first three-dimensional array comprising a first selected word line;
a second semiconductor die comprising a second three-dimensional array of non-volatile memory cells, the second three-dimensional array comprising a second selected word line;
a third semiconductor die comprising control circuitry configured to control memory operations in the first three-dimensional array in parallel with the second three-dimensional array, the third semiconductor die further comprising a word line driver;
first pairs of bond pads configured to electrically and physically couple the first semiconductor die to the third semiconductor die, the first pairs of bond pads configured to permit memory operation signal transfer between the first semiconductor die and the third semiconductor die, the word line driver connected to a first member of one of the first pairs of bond pads, the first selected word line connected to a second member of the one of the first pairs of bond pads; and
second pairs of bond pads configured to electrically and physically couple either the second semiconductor die to the third semiconductor die or electrically and physically couple the first semiconductor die to the second semiconductor die, the second pairs of bond pads configured to further configured to permit memory operation signal transfer either between the second semiconductor die and the third semiconductor die or between the first semiconductor die and the second semiconductor die, the word line driver connected to a first member of one of the second pairs of bond pads, the second selected word line connected to a second member of the one of the second pairs of bond pads.

10. The integrated memory module of claim 9, further comprising:
first sense amplifiers on the third semiconductor die connected to first members of the first pairs of bond pads other than the first member of the first pair of bond pads to which the word line driver is connected;
first bit lines in the first semiconductor die connected to second members of the first pairs of bond pads other than the second member of the first pair of bond pads to which the first selected word line is connected;
second sense amplifiers on the third semiconductor die connected to first members of the second pairs of bond pads other than the first member of the second pair of bond pads to which the word line driver is connected; and
second bit lines in the second semiconductor die connected to second members of the second pairs of bond pads other than the second member of the second pair of bond pads to which the second selected word line is connected.

11. The integrated memory module of claim 9, wherein:
the second pairs of bond pads are further configured to electrically and physically couple the second semiconductor die to the third semiconductor die to permit memory operation signal transfer between the second semiconductor die and the third semiconductor die.

12. The integrated memory module of claim 9, wherein:
the second pairs of bond pads are further configured to electrically and physically couple the first semiconductor die to the second semiconductor die to permit memory operation signal transfer between the first semiconductor die and the second semiconductor die.

13. The integrated memory module of claim 9, wherein the control circuit is further configured to store a first portion of a page of data in the first three-dimensional array in parallel with storing a second portion of the page of data in the second three-dimensional array.

14. An integrated memory module, comprising:
a first semiconductor die comprising a first three-dimensional array of non-volatile memory cells, the first semiconductor die further comprising first bit lines;
a second semiconductor die comprising a second three-dimensional array of non-volatile memory cells, the second semiconductor die further comprising second bit lines;
a third semiconductor die comprising control circuitry configured to control memory operations in the first three-dimensional array in parallel with the second three-dimensional array, the third semiconductor die further comprising first sense amplifiers and second sense amplifiers;
first pairs of bond pads configured to electrically and physically couple the first semiconductor die to the third semiconductor die, the first pairs of bond pads configured to permit memory operation signal transfer between the first semiconductor die and the third semiconductor die, the first sense amplifiers connected to first members of the first pairs of bond pads, the first bit line connected to second members of the first pairs of bond pads; and
second pairs of bond pads configured to electrically and physically couple either the second semiconductor die to the third semiconductor die or electrically and physically couple the first semiconductor die to the second semiconductor die, the second pairs of bond pads configured to further configured to permit memory operation signal transfer either between the second semiconductor die and the third semiconductor die or between the first semiconductor die and the second semiconductor die, the second sense amplifiers connected to first members of the second pairs of bond pads, the second bit lines connected to second members of the second pairs of bond pads.

15. An apparatus, comprising:
a first semiconductor die comprising first non-volatile memory cells and a first word line connected to a first group of the first non-volatile memory cells;
a second semiconductor die comprising second non-volatile memory cells and a second word line connected to a second group of the second non-volatile memory cells; and
a third semiconductor die comprising control circuitry, the first, the second and the third semiconductor die bonded together, the control circuitry configured to control memory operations in the first memory cells in parallel with the second memory cells, wherein the control circuitry comprises a word line driver coupled to the first word line and to the second word line, wherein the control circuitry is configured to control the word line driver to concurrently deliver a voltage to the first word line and to the second word line.

16. The apparatus of claim 15, wherein:
the third semiconductor die is bonded to the first semiconductor die; and
the first semiconductor die is bonded to the second semiconductor die.

17. The apparatus of claim 15, wherein the control circuitry is further configured to:
program data into the first group of the first non-volatile memory cells connected to the first word line in the first semiconductor die in parallel with programming data into the second group of the second non-volatile memory cells connected to the second word line in the second semiconductor die.

18. An apparatus, comprising:
a first semiconductor die comprising first non-volatile memory cells and first bit lines associated with the first memory cells;
a second semiconductor die comprising second non-volatile memory cells and second bit lines associated with the second memory cells; and
a third semiconductor die comprising control circuitry, the third semiconductor die bonded to the first semiconductor die, the third semiconductor die bonded to the second semiconductor die, the control circuitry comprising a first plurality of sense amplifiers connected to the first bit lines, the control circuitry comprising a second plurality of sense amplifiers connected to the second bit lines, the control circuitry configured to sense the first memory cells in parallel with the second memory cells.

19. The apparatus of claim 18, wherein:
the third semiconductor die is bonded to the first semiconductor die by first bond pads;
the third semiconductor die is bonded to the second semiconductor die by second bond pads;
the first plurality of sense amplifiers are connected to the first bit lines through a first group of the first bond pads; and
the second plurality of sense amplifiers are connected to the second bit lines through a second group of the second bond pads.

* * * * *